United States Patent
Lin et al.

(10) Patent No.: US 10,601,447 B2
(45) Date of Patent: Mar. 24, 2020

(54) FIELD PRIORITIZATION FOR POLAR CODES

(71) Applicant: QUALCOMM Incorporated, San Diego, CA (US)

(72) Inventors: Jamie Menjay Lin, San Diego, CA (US); Krishna Kiran Mukkavilli, San Diego, CA (US); Gabi Sarkis, San Diego, CA (US); Peter Pui Lok Ang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 127 days.

(21) Appl. No.: 15/976,676

(22) Filed: May 10, 2018

(65) Prior Publication Data

US 2018/0331699 A1 Nov. 15, 2018

Related U.S. Application Data

(60) Provisional application No. 62/506,307, filed on May 15, 2017.

(51) Int. Cl.
*H03M 13/13* (2006.01)
*H04L 5/00* (2006.01)
(Continued)

(52) U.S. Cl.
CPC ......... *H03M 13/13* (2013.01); *H03M 13/356* (2013.01); *H04L 1/0045* (2013.01);
(Continued)

(58) Field of Classification Search
CPC .... H03M 13/13; H03M 13/356; H03M 13/09; H04L 5/0051; H04L 5/0016;
(Continued)

(56) References Cited

U.S. PATENT DOCUMENTS

| 5,271,004 A | * | 12/1993 | Proctor | ........... | H04L 12/18 |
| | | | | | 370/392 |
| 2005/0089045 A1 | * | 4/2005 | Shim | ........... | H04W 4/00 |
| | | | | | 370/395.42 |

(Continued)

OTHER PUBLICATIONS

Intel Corporation: "Study of Early Termination Techniques for Polar Code", 3GPP Draft; R1-1708316, 3rd Generation Partnership Project (3gpp), Mobile Competence Centre; 650, Route Des Lucioles; F-06921 Sophia-Antipol, vol. RAN WG1, No. Hangzhou; May 15, 2017-May 19, 2017 May 14, 2017, XP051273509, Retrieved from the Internet: URL:http://www.3gpp.org/ftp/Meetings_3GPP_SYNC/RAN1/Docs/ [retrieved on May 14, 2017], 9 pages.

(Continued)

*Primary Examiner* — Guy J Lamarre
(74) *Attorney, Agent, or Firm* — Holland & Hart LLP

(57) ABSTRACT

Methods, systems, and devices for wireless communication are described. In a new radio (NR) system, a wireless device may encode control information into a codeword using a polar code. The device may prioritize certain information within the codeword due to the time criticalness of that information for processing at a receiving device. For example, information related to frequency allocation may be encoded such that the receiving device may decode the frequency allocation information early in the decoding process. The device may include partial parity checks throughout the codeword, so that the receiving device may test whether the decoded bits for the prioritized information pass a parity check, and may then send these decoded bits for processing before completing decoding of the codeword. In some cases, the device may encode the information to be transmitted using multiple evenized codewords, or using a single consolidated codeword.

72 Claims, 16 Drawing Sheets

(51) Int. Cl.
*H04L 1/00* (2006.01)
*H03M 13/35* (2006.01)
*H04W 72/10* (2009.01)
*H03M 13/09* (2006.01)

(52) U.S. Cl.
CPC .......... *H04L 1/0057* (2013.01); *H04L 1/0061* (2013.01); *H04L 1/0071* (2013.01); *H04L 1/0072* (2013.01); *H04L 5/0016* (2013.01); *H04L 5/0051* (2013.01); *H03M 13/09* (2013.01); *H04W 72/10* (2013.01)

(58) Field of Classification Search
CPC ... H04L 1/0071; H04L 1/0072; H04L 1/0045; H04L 1/0057; H04L 1/0061; H04W 72/10
See application file for complete search history.

(56) References Cited

U.S. PATENT DOCUMENTS

| | | | | |
|---|---|---|---|---|
| 2008/0175265 | A1* | 7/2008 | Yonge | H04B 3/54 370/447 |
| 2012/0051354 | A1* | 3/2012 | Lv | H04W 40/246 370/341 |
| 2017/0353269 | A1* | 12/2017 | Lin | H03M 13/2906 |
| 2019/0190655 | A1* | 6/2019 | Pan | H03M 13/356 |
| 2019/0215133 | A1* | 7/2019 | Pan | H04L 1/0003 |
| 2019/0238270 | A1* | 8/2019 | Pan | H03M 13/09 |
| 2019/0312679 | A1* | 10/2019 | Jayasinghe | H03M 13/13 |

OTHER PUBLICATIONS

International Search Report and Written Opinion—PCT/US2018/032429—ISA/EPO—dated Sep. 11, 2018.

Qualcomm Incorporated: "Early Termination for Polar Codes", 3GPP Draft; R1-1708644 Early Termination for Polar Codes, 3rd Generation Partnership Project (3gpp), Mobile Competence Centre; 650, Route Des Lucioles; F-06921 Sophia-Antipol, vol. RAN WG1, No. Hangzhou; May 15, 2017-May 19, 2017 May 14, 2017, XP051273831, Retrieved from the Internet: URL:http://www.3gpp.org/ftp/Meetings_3GPP_SYNC/RAN1/Docs/ [retrieved on May 14, 2017], 15 pages.

Yu Q., et al., "Hybrid Parity-Check and CRC Aided SCL Decoding for Polar codes", 2016 IEEE International Conference on Internet of Things (iThings) and IEEE Green Computing and Communications (GreenCom) and IEEE Cyber, Physical and Social Computing (CPSCom) and IEEE Smart Data (SmartData), Dec. 31, 2016, pp. 711-716.

* cited by examiner

FIELD PRIORITIZATION FOR POLAR CODES

CROSS REFERENCES

The present application for patent claims priority to U.S. Provisional Patent Application No. 62/506,307 by Lin et al., entitled, "Field Prioritization For Polar Codes," filed May 15, 2017, which is assigned to the assignee hereof and expressly incorporated herein.

BACKGROUND

The following relates generally to wireless communication, and more specifically to field prioritization for polar codes.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems (e.g., a Long Term Evolution (LTE) system, or a New Radio (NR) system). A wireless multiple-access communications system may include a number of base stations or access network nodes, each simultaneously supporting communication for multiple communication devices, which may be otherwise known as user equipment (UE).

Information transmitted between devices in wireless multiple-access communications systems may be encoded into a codeword in order to improve the reliability of successfully decoding the transmitted information. In some cases, codewords may provide redundancy, which may be used to correct errors that result from the transmission environment (e.g., path loss, obstacles). Some examples of encoding algorithms with error correcting codes include convolutional codes (CCs), low-density parity-check (LDPC) codes, and polar codes. A polar code is an example of a linear block error correcting code and has been shown to asymptotically approach the theoretical channel capacity as the code length increases. Polar codes are based on polarization of sub-channels used for information bits or frozen bits (e.g., predetermined bits set to a '0' or a '1'), with information bits generally assigned to the higher reliability sub-channels. However, practical implementations of a polar decoder are complex (e.g., due to the ordered nature of decoding and list decoding techniques used for improving the error-correcting performance) and may introduce latency in order to increase reliability. As such, traditional polar coding techniques may not adequately meet the low latency standards of some wireless communications. Techniques for high-performance polar codes for low latency communications are desired.

SUMMARY

The described techniques relate to improved methods, systems, devices, or apparatuses that support field prioritization for polar codes. Generally, the described techniques provide for receiving and transmitting a codeword encoded using a polar code. An encoder obtains the codeword from a plurality of information bits as well as one or more frozen bits according to the polar code. The information bits may be allocated to a given set of polar channel indices and different sets of the information bits may be associated with different priorities. The set of information bits associated with a higher priority may be allocated to polar channel indices to be decoded earlier in a decoding process and may be followed by a parity check or cyclic redundancy check (CRC), which may be used by a decoder to error check the preceding set of information bits. Based on the results of the error checking, a decoding device may determine to take an early action based on the set of information bits that passed error checking prior to completing the decoding process on the entire codeword. Such techniques may allow for determination or application of higher priority sets of information bits to wireless communication operations prior to completion of a decoding process for all information bits.

A method of wireless communication is described. The method may include identifying a plurality of control information fields associated with control signaling for a user equipment (UE) for encoding using a polar code, the plurality of control information fields including a first field having a first priority and a second field having a second priority that is lower than the first priority, determining a first partial check value as a function of at least the first field and a combined check value as a function of at least the first field and the second field, generating an information vector based on the plurality of control information fields, the first partial check value, and the combined check value, assigning bits of the information vector to respective polar channel indices of the polar code based at least in part on a decoding order for the polar code, where the first partial check value is assigned to a set of polar channel indices between bits of the first field and bits of the second field according to the decoding order, encoding, based at least in part on the respective polar channel indices, the information vector to generate a codeword to be decoded according to the decoding order, and transmitting the codeword to the UE in a control channel transmission.

An apparatus for wireless communication is described. The apparatus may include means for identifying a plurality of control information fields associated with control signaling for a UE for encoding using a polar code, the plurality of control information fields including a first field having a first priority and a second field having a second priority that is lower than the first priority, means for determining a first partial check value as a function of at least the first field and a combined check value as a function of at least the first field and the second field, means for generating an information vector based on the plurality of control information fields, the first partial check value, and the combined check value, means for assigning bits of the information vector to respective polar channel indices of the polar code based at least in part on a decoding order for the polar code, where the first partial check value is assigned to a set of polar channel indices between bits of the first field and bits of the second field according to the decoding order, means for encoding, based at least in part on the respective polar channel indices, the information vector to generate a codeword to be decoded according to the decoding order, and means for transmitting the codeword to the UE in a control channel transmission.

Another apparatus for wireless communication is described. The apparatus may include a processor, memory in electronic communication with the processor, and instructions stored in the memory. The instructions may be operable to cause the processor to identify a plurality of control information fields associated with control signaling for a UE for encoding using a polar code, the plurality of control information fields including a first field having a first priority and a second field having a second priority that is lower than the first priority, determine a first partial check value as a function of at least the first field and a combined check value as a function of at least the first field and the second field, generate an information vector based on the plurality of control information fields, the first partial check value, and the combined check value, assign bits of the information vector to respective polar channel indices of the polar code based at least in part on a decoding order for the polar code, where the first partial check value is assigned to a set of polar channel indices between bits of the first field and bits of the second field according to the decoding order, encode, based at least in part on the respective polar channel indices, the information vector to generate a codeword to be decoded according to the decoding order, and transmit the codeword to the UE in a control channel transmission.

A non-transitory computer readable medium for wireless communication is described. The non-transitory computer-readable medium may include instructions operable to cause a processor to identify a plurality of control information fields associated with control signaling for a UE for encoding using a polar code, the plurality of control information fields including a first field having a first priority and a second field having a second priority that is lower than the first priority, determine a first partial check value as a function of at least the first field and a combined check value as a function of at least the first field and the second field, generate an information vector based on the plurality of control information fields, the first partial check value, and the combined check value, assign bits of the information vector to respective polar channel indices of the polar code based at least in part on a decoding order for the polar code, where the first partial check value is assigned to a set of polar channel indices between bits of the first field and bits of the second field according to the decoding order, encode, based at least in part on the respective polar channel indices, the information vector to generate a codeword to be decoded according to the decoding order, and transmit the codeword to the UE in a control channel transmission.

Some examples of the method, apparatus, and non-transitory computer-readable medium described above may further include processes, features, means, or instructions for generating a second partial check value as a function of at least the second field, where the second partial check value may be assigned to a second set of polar channel indices between bits of the second field and bits of the combined check value.

In some examples of the method, apparatus, and non-transitory computer-readable medium described above, the plurality of control information fields includes a third field having a third priority that may be lower than the second priority, and the second set of polar channel indices may be between bits of the second field and bits of the third field.

Some examples of the method, apparatus, and non-transitory computer-readable medium described above may further include processes, features, means, or instructions for transmitting, to the UE, the codeword via a physical downlink control channel (PDCCH) message.

Some examples of the method, apparatus, and non-transitory computer-readable medium described above may further include processes, features, means, or instructions for receiving, in response to the PDCCH message, a demodulation reference signal (DMRS) from the UE transmitted based at least in part on information indicated by the first field, where the DMRS may be received within a predetermined time interval after transmission of the codeword.

In some examples of the method, apparatus, and non-transitory computer-readable medium described above, the predetermined time interval may be three symbols.

Some examples of the method, apparatus, and non-transitory computer-readable medium described above may further include processes, features, means, or instructions for generating a second information vector including at least a third field of the plurality of control information fields, where the information vector includes an indication for the second information vector. Some examples of the method, apparatus, and non-transitory computer-readable medium described above may further include processes, features, means, or instructions for encoding the second information vector to generate a second codeword, where the transmitting includes transmitting the second codeword to the UE in the control channel transmission.

In some examples of the method, apparatus, and non-transitory computer-readable medium described above, the codeword and the second codeword may be a same size.

Some examples of the method, apparatus, and non-transitory computer-readable medium described above may further include processes, features, means, or instructions for generating a third information vector including at least a last field of the plurality of control information fields. Some examples of the method, apparatus, and non-transitory computer-readable medium described above may further include processes, features, means, or instructions for encoding the third information vector to generate a third codeword including a different number of bits than the codeword and the second codeword, where the transmitting includes transmitting the third codeword to the UE in the control channel transmission.

In some examples of the method, apparatus, and non-transitory computer-readable medium described above, the information vector and the second information vector may be a same size.

Some examples of the method, apparatus, and non-transitory computer-readable medium described above may further include processes, features, means, or instructions for determining, based at least in part on a latency threshold associated with the control signaling, whether to divide the plurality of control information fields into a plurality of information vectors for encoding into a plurality of codewords of a first size or to consolidate the plurality of control information fields into a single information vector for encoding into a single codeword of a second size, the second size being larger than the first size.

In some examples of the method, apparatus, and non-transitory computer-readable medium described above, the first field indicates a frequency domain resource allocation for the UE.

In some examples of the method, apparatus, and non-transitory computer-readable medium described above, the first field indicates header information corresponding to the plurality of control information fields.

In some examples of the method, apparatus, and non-transitory computer-readable medium described above, the first partial check value and the combined check value each include one of a parity check value or a cyclic redundancy check (CRC) value.

A method of wireless communication is described. The method may include receiving, at a UE, a codeword encoded using a polar code, the codeword generated based at least in part on an information vector including a plurality of control information fields including a first field having a first priority and a second field having a second priority that is lower than the first priority, a first partial check value determined as a function of at least the first field, and a combined check value determined as a function of at least the first field and the second field, performing a sequential list decoding operation on the codeword in order of bit channel indices of the polar code, where performing the sequential list decoding operation includes performing, for a plurality of list decoding paths, an error check process using the first partial check value on first respective partial representations of the information vector comprising at least the first field, and determining a control information parameter for a transmission associated with the UE based at least in part on a decoding path of the plurality of list decoding paths having a first respective partial representation of the information vector that passes the error check process, and provisionally applying, prior to completion of the sequential list decoding operation on the codeword, the control information parameter for the transmission.

An apparatus for wireless communication is described. The apparatus may include means for receiving, at a UE, a codeword encoded using a polar code, the codeword generated based at least in part on an information vector including a plurality of control information fields including a first field having a first priority and a second field having a second priority that is lower than the first priority, a first partial check value determined as a function of at least the first field, and a combined check value determined as a function of at least the first field and the second field, means for performing a sequential list decoding operation on the codeword in order of bit channel indices of the polar code, where the means for performing the sequential list decoding operation includes means for performing, for a plurality of list decoding paths, an error check process using the first partial check value on first respective partial representations of the information vector comprising at least the first field, and means for determining a control information parameter for a transmission associated with the UE based at least in part on a decoding path of the plurality of list decoding paths having a first respective partial representation of the information vector that passes the error check process, and means for provisionally applying, prior to completion of the sequential list decoding operation on the codeword, the control information parameter for the transmission.

Another apparatus for wireless communication is described. The apparatus may include a processor, memory in electronic communication with the processor, and instructions stored in the memory. The instructions may be operable to cause the processor to receive, at a UE, a codeword encoded using a polar code, the codeword generated based at least in part on an information vector including a plurality of control information fields including a first field having a first priority and a second field having a second priority that is lower than the first priority, a first partial check value determined as a function of at least the first field, and a combined check value determined as a function of at least the first field and the second field, perform a sequential list decoding operation on the codeword in order of bit channel indices of the polar code, where performing the sequential list decoding operation includes performing, for a plurality of list decoding paths, an error check process using the first partial check value on first respective partial representations of the information vector comprising at least the first field, and determining a control information parameter for a transmission associated with the UE based at least in part on a decoding path of the plurality of list decoding paths having a first respective partial representation of the information vector that passes the error check process, and provisionally apply, prior to completion of the sequential list decoding operation on the codeword, the control information parameter for the transmission.

A non-transitory computer readable medium for wireless communication is described. The non-transitory computer-readable medium may include instructions operable to cause a processor to receive, at a UE, a codeword encoded using a polar code, the codeword generated based at least in part on an information vector including a plurality of control information fields including a first field having a first priority and a second field having a second priority that is lower than the first priority, a first partial check value determined as a function of at least the first field, and a combined check value determined as a function of at least the first field and the second field, perform a sequential list decoding operation on the codeword in order of bit channel indices of the polar code, wherein performing the sequential list decoding operation includes performing, for a plurality of list decoding paths, an error check process using the first partial check value on first respective partial representations of the information vector comprising at least the first field, and determining a control information parameter for a transmission associated with the UE based at least in part on a decoding path of the plurality of list decoding paths having a first respective partial representation of the information vector that passes the error check process, and provisionally apply, prior to completion of the sequential list decoding operation on the codeword, the control information parameter for the transmission.

In some examples of the method, apparatus, and non-transitory computer-readable medium described above, performing the sequential list decoding operation includes: performing, for the plurality of list decoding paths, a second error check process on second respective partial representations of the information vector for the plurality of list decoding paths using a second partial check value, the second respective partial representations of the information vector being subsequent to the first respective partial representations of the information vector according to the order of bit channel indices of the polar code.

Some examples of the method, apparatus, and non-transitory computer-readable medium described above may further include processes, features, means, or instructions for revoking the provisional application of the control information parameter for the transmission based at least in part on a failure of the second error check process for the decoding path.

Some examples of the method, apparatus, and non-transitory computer-readable medium described above may further include processes, features, means, or instructions for terminating, prior to completion of the sequential list decoding operation on the codeword, the sequential list decoding operation based at least in part on a failure of the second error check process for the decoding path.

Some examples of the method, apparatus, and non-transitory computer-readable medium described above may further include processes, features, means, or instructions for terminating, prior to completion of the sequential list decoding operation on the codeword, the sequential list decoding operation based at least in part on a failure of the second error check process for all of the plurality of decoding paths.

Some examples of the method, apparatus, and non-transitory computer-readable medium described above may further include processes, features, means, or instructions for initiating, prior to completion of the sequential list decoding operation, a modem configuration for the transmission based at least in part on the control information parameter, where the modem configuration may be associated with a DMRS transmitted by the UE in response to receiving the plurality of control information fields, where the DMRS may be to be transmitted within a predetermined time interval after receiving the plurality of control information fields.

In some examples of the method, apparatus, and non-transitory computer-readable medium described above, the predetermined time interval includes three symbols.

Some examples of the method, apparatus, and non-transitory computer-readable medium described above may further include processes, features, means, or instructions for receiving the second codeword encoded using the polar code, the second codeword generated based at least in part on a second information vector including at least one of the plurality of control information fields. Some examples of the method, apparatus, and non-transitory computer-readable medium described above may further include processes, features, means, or instructions for performing a second sequential list decoding operation on the second codeword to obtain the at least one of the plurality of control information fields.

In some examples of the method, apparatus, and non-transitory computer-readable medium described above, the codeword and the second codeword include a same number of bits.

In some examples of the method, apparatus, and non-transitory computer-readable medium described above, the first field indicates a frequency domain resource allocation for the UE.

DETAILED DESCRIPTION

Figure 1:
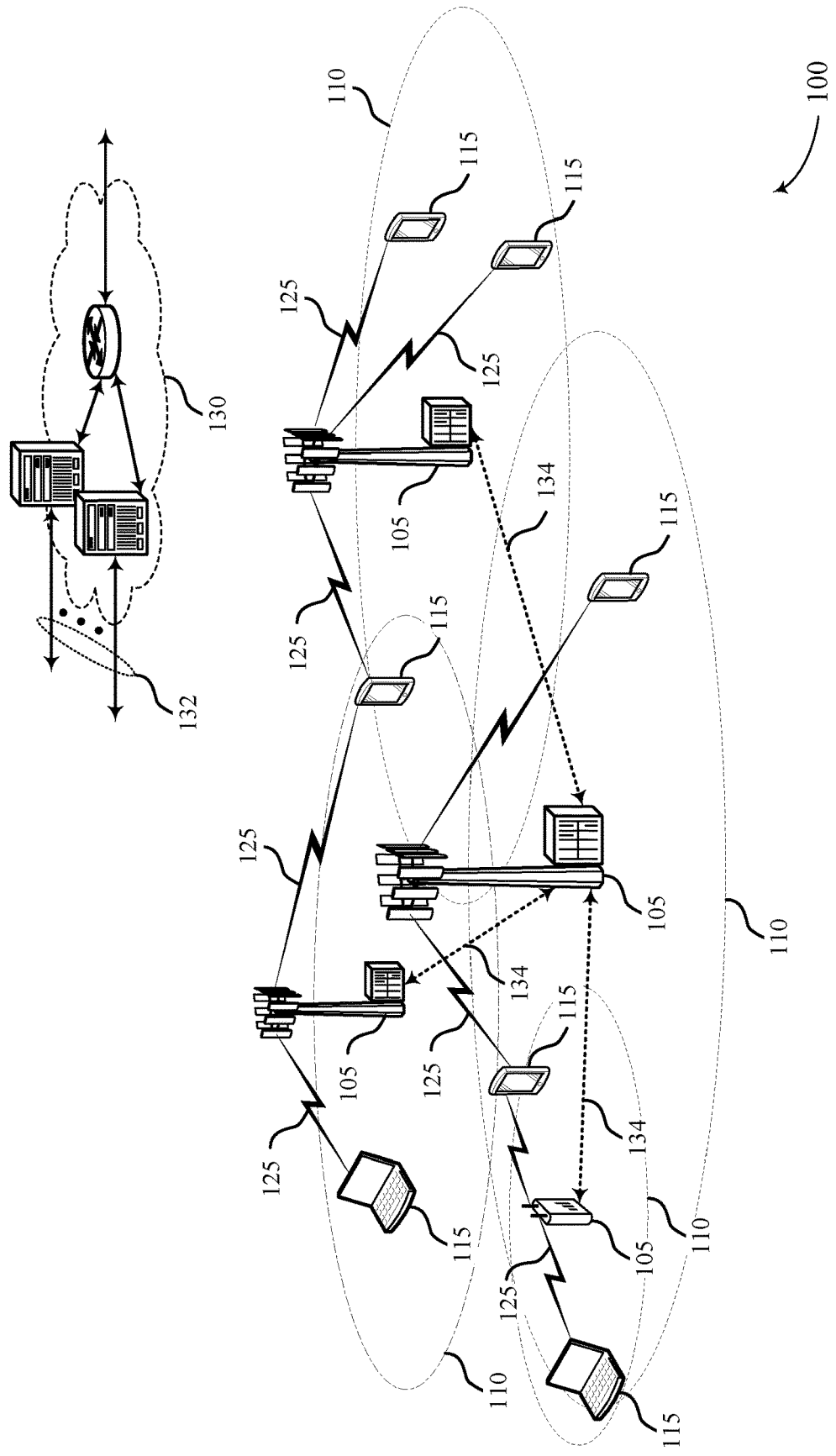
FIG. 1 illustrates an example of a wireless communications system that supports field prioritization for polar codes in accordance with aspects of the present disclosure.

In some wireless systems, a base station or a user equipment (UE) may transmit a payload containing information to be decoded at a receiving device. The information may be organized in multiple fields and each field may have an associated priority value. For example, typical fields within downlink control information (DCI) include a resource block (RB) allocation, a hybrid automatic repeat request (HARD) index, a new data indicator (NDI) field, a modulation and coding scheme (MCS) index, a redundancy version (RV), precoding information fields, transmit power control (TPC) for uplink grants, and the like. Some fields such as the RB allocation may have a high time criticalness because the field is used in a front stage of a modulator or demodulator (e.g., modem). For example, for a downlink transmission, the RB allocation may be used for demodulation and demapping, while other fields such as the MCS index, RV, and NDI fields are used on the demodulated and demapped symbols later in the demodulator processing. Similarly, the RB allocation may be used on the uplink for generating a demodulation reference signal (DMRS), which may occur in a first symbol of an uplink transmission.

According to various aspects, a base station encoding a codeword for transmission to the UE may allocate information bits associated with higher priority to polar channel indices to be decoded earlier in the decoding process. The information bits of the higher priority may be followed by a parity check or cyclic redundancy check (CRC) field used for error checking the higher priority information bits. In this manner, during the decoding process, the UE may be able to decode the higher priority information bits and perform an error check process on these bits. If the error check process is successful, the UE may make a provisional decision to apply the higher priority information bits based on the decoded information bits.

In some instances, multiple sets of information bits may be encoded in a codeword, each of which may be associated with a different priority level. A parity check or CRC field may follow each set of information bits, which may be used by the receiving device to perform error checking of the preceding information bits. This may allow the receiving device to decode sets of information bits in order of priority and perform error checking on each set of information bits to determine a likelihood of successful decode of the codeword. Based on the results of the error checking, the receiving device may make a determination to utilize the decoded information bits prior to completion of the decoding process on the entire codeword.

Some wireless communications systems may support the use of polar codes, which are a type of linear block error correcting code that has been shown to approach the theoretical channel capacity as the code length increases. The number of sub-channels for polar codes follows a power function (e.g., $2^X$), where a number of information bits are mapped to different polarized sub-channels (e.g., polar channel indices). The capacity of a given polar channel index may be a function of a reliability metric of the polar channel index. Information bits may be loaded on a set of polar channel indices, and the remaining bits (e.g., parity bits and frozen bits) may be loaded on the remaining polarized bit channels. The number of permutations for the set of polar channel indices for a given polar code length may be large. As an example, a codeword may be encoded using a polar code of length 256, of which 16 polar channel indices are allocated as information bits. In such a scenario, the number of potential information bit polar index sets (i.e., the number of groups of 16 indices in which at least one index differs between each set) is on the order of 1038.

Aspects of the disclosure are initially described in the context of a wireless communications system. Aspects are then described with respect to a device, a process for codeword generation, a decoding process, a process timeline, and a process flow. Aspects of the disclosure are further illustrated by and described with reference to apparatus diagrams, system diagrams, and flowcharts that relate to field prioritization for polar codes.

FIG. 1 illustrates an example of a wireless communications system 100 in accordance with various aspects of the present disclosure. The wireless communications system 100 includes base stations 105, UEs 115, and a core network 130. In some examples, the wireless communications system 100 may be a Long Term Evolution (LTE), LTE-Advanced (LTE-A) network, LTE-Pro, or a New Radio (NR) network. In some cases, wireless communications system 100 may support enhanced broadband communications, ultra-reliable (i.e., mission critical) communications, low latency communications, and communications with low-cost and low-complexity devices.

Base stations 105 may wirelessly communicate with UEs 115 via one or more base station antennas. Each base station 105 may provide communication coverage for a respective geographic coverage area 110. Communication links 125 shown in wireless communications system 100 may include uplink transmissions from a UE 115 to a base station 105, or downlink transmissions, from a base station 105 to a UE 115. Control information and data may be multiplexed on an uplink channel or downlink according to various techniques. Control information and data may be multiplexed on a downlink channel, for example, using time division multiplexing (TDM) techniques, frequency division multiplexing (FDM) techniques, or hybrid TDM-FDM techniques. In some examples, the control information transmitted during a transmission time interval (TTI) of a downlink channel may be distributed between different control regions in a cascaded manner (e.g., between a common control region and one or more UE-specific control regions).

UEs 115 may be dispersed throughout the wireless communications system 100, and each UE 115 may be stationary or mobile. A UE 115 may also be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may also be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of Things (IoT) device, an Internet of Everything (IoE) device, a machine type communication (MTC) device, an appliance, an automobile, or the like.

In some cases, a UE 115 may also be able to communicate directly with other UEs (e.g., using a peer-to-peer (P2P) or device-to-device (D2D) protocol). One or more of a group of UEs 115 utilizing D2D communications may be within the coverage area 110 of a cell. Other UEs 115 in such a group may be outside the coverage area 110 of a cell, or otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out independent of a base station 105.

Some UEs 115, such as MTC or IoT devices, may be low cost or low complexity devices, and may provide for automated communication between machines, i.e., Machine-to-Machine (M2M) communication. M2M or MTC may refer to data communication technologies that allow devices to communicate with one another or a base station without human intervention. For example, M2M or MTC may refer to communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

In some cases, an MTC device may operate using half-duplex (one-way) communications at a reduced peak rate. MTC devices may also be configured to enter a power saving "deep sleep" mode when not engaging in active communications. In some cases, MTC or IoT devices may be designed to support mission critical functions and wireless communications system may be configured to provide ultra-reliable communications for these functions.

Base stations 105 may communicate with the core network 130 and with one another. For example, base stations 105 may interface with the core network 130 through backhaul links 132 (e.g., S1). Base stations 105 may communicate with one another over backhaul links 134 (e.g., X2) either directly or indirectly (e.g., through core network 130). Base stations 105 may perform radio configuration and scheduling for communication with UEs 115, or may operate under the control of a base station controller (not shown). In some examples, base stations 105 may be macro cells, small cells, hot spots, or the like. Base stations 105 may also be referred to as evolved NodeBs (eNBs) 105.

A base station 105 may be connected by an S1 interface to the core network 130. The core network may be an evolved packet core (EPC), which may include at least one mobility management entity (MME), at least one serving gateway (S-GW), and at least one Packet Data Network (PDN) gateway (P-GW). The MME may be the control node that processes the signaling between the UE 115 and the EPC. All user Internet Protocol (IP) packets may be transferred through the S-GW, which itself may be connected to the P-GW. The P-GW may provide IP address allocation as well as other functions. The P-GW may be connected to the network operators IP services. The operators IP services may include the Internet, the Intranet, an IP Multimedia Subsystem (IMS), and a Packet-Switched (PS) Streaming Service.

The core network 130 may provide user authentication, access authorization, tracking, IP connectivity, and other access, routing, or mobility functions. At least some of the network devices may include subcomponents such as an access network entity, which may be an example of an access node controller (ANC). Each access network entity may communicate with a number of UEs 115 through a number of other access network transmission entities, each of which may be an example of a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate in an ultra-high frequency (UHF) frequency region using frequency bands from 700 MHz to 2600 MHz (2.6 GHz), although some networks (e.g., a wireless local area network (WLAN)) may use frequencies as high as 4 GHz. This region may also be known as the decimeter band, since the wavelengths range from approximately one decimeter to one meter in length. UHF waves may propagate mainly by line of sight, and may be blocked by buildings and environmental features. However, the waves may penetrate walls sufficiently to provide service to UEs 115 located indoors. Transmission of UHF waves is characterized by smaller antennas and shorter range (e.g., less than 100 km) compared to transmission using the smaller frequencies (and longer waves) of the high frequency (HF) or very high frequency (VHF) portion of the spectrum. In some cases, wireless communications system 100 may also utilize extremely high frequency (EHF) portions of the spectrum (e.g., from 30 GHz to 300 GHz). This region may also be known as the millimeter band, since the wavelengths range from approximately one millimeter to one centimeter in length. Thus, EHF antennas may be even smaller and more closely spaced than UHF antennas. In some cases, this may facilitate use of antenna arrays within a UE 115 (e.g., for directional beamforming). However, EHF transmissions may be subject to even greater atmospheric attenuation and shorter range than UHF transmissions.

Thus, wireless communications system 100 may support millimeter wave (mmW) communications between UEs 115 and base stations 105. Devices operating in mmW or EHF bands may have multiple antennas to allow beamforming. That is, a base station 105 may use multiple antennas or antenna arrays to conduct beamforming operations for directional communications with a UE 115. Beamforming (which may also be referred to as spatial filtering or directional transmission) is a signal processing technique that may be used at a transmitter (e.g., a base station 105) to shape and/or steer an overall antenna beam in the direction of a target receiver (e.g., a UE 115). This may be achieved by combining elements in an antenna array in such a way that transmitted signals at particular angles experience constructive interference while others experience destructive interference.

Multiple-input multiple-output (MIMO) wireless systems use a transmission scheme between a transmitter (e.g., a base station 105) and a receiver (e.g., a UE 115), where both transmitter and receiver are equipped with multiple antennas. Some portions of wireless communications system 100 may use beamforming. For example, base station 105 may have an antenna array with a number of rows and columns of antenna ports that the base station 105 may use for beamforming in its communication with UE 115. Signals may be transmitted multiple times in different directions (e.g., each transmission may be beamformed differently). A mmW receiver (e.g., a UE 115) may try multiple beams (e.g., antenna subarrays) while receiving the synchronization signals.

In some cases, the antennas of a base station 105 or UE 115 may be located within one or more antenna arrays, which may support beamforming or MIMO operation. One or more base station antennas or antenna arrays may be collocated at an antenna assembly, such as an antenna tower. In some cases, antennas or antenna arrays associated with a base station 105 may be located in diverse geographic locations. A base station 105 may multiple use antennas or antenna arrays to conduct beamforming operations for directional communications with a UE 115.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may in some cases perform packet segmentation and reassembly to communicate over logical channels. A Medium Access Control (MAC) layer may perform priority handling and multiplexing of logical channels into transport channels. The MAC layer may also use HARQ to provide retransmission at the MAC layer to improve link efficiency. In the control plane, the Radio Resource Control (RRC) protocol layer may provide establishment, configuration, and maintenance of an RRC connection between a UE 115 and a network device such as a base station 105, or core network 130 supporting radio bearers for user plane data. At the Physical (PHY) layer, transport channels may be mapped to physical channels.

A shared radio frequency spectrum band may be utilized in an NR shared spectrum system. For example, an NR shared spectrum may utilize any combination of licensed, shared, and unlicensed spectrums, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across frequency) and horizontal (e.g., across time) sharing of resources.

In some cases, wireless communications system 100 may utilize both licensed and unlicensed radio frequency spectrum bands. For example, wireless communications system 100 may employ LTE License Assisted Access (LTE-LAA) or LTE Unlicensed (LTE-U) radio access technology or NR technology in an unlicensed band such as the 5 GHz Industrial, Scientific, and Medical (ISM) band. When operating in unlicensed radio frequency spectrum bands, wireless devices such as base stations 105 and UEs 115 may employ listen-before-talk (LBT) procedures to ensure the channel is clear before transmitting data. In some cases, operations in unlicensed bands may be based on a CA configuration in conjunction with CCs operating in a licensed band. Operations in unlicensed spectrum may include downlink transmissions, uplink transmissions, or both. Duplexing in unlicensed spectrum may be based on frequency division duplexing (FDD), time division duplexing (TDD) or a combination of both.

In wireless communications system 100, a base station 105 may encode time sensitive information (e.g., data to be used by a UE 115 in a time sensitive process) in a codeword using a polar code. The base station 105 may generate the codeword such that the time sensitive information is decoded earlier in a decoding process (e.g., a successive cancellation (SC) decoding process) by a UE 115. Following the time sensitive information, the base station may encode a CRC value or parity check bit(s) that may be used by the UE to error check a portion of the codeword (e.g., the time sensitive information portion) during the decoding process. Based on the results of the error check, the UE 115 may determine and/or select decoded bits for early application in the time sensitive process.

In some wireless systems, such as wireless communications system 100, a base station 105 or a UE 115 may transmit a payload containing multiple fields of parameters, where each field may have an associated priority value. For example, a base station 105 may transmit control signaling on the physical downlink control channel (PDCCH) in a DCI payload. For uplink or downlink grants, the DCI payload may include an RB allocation, a HARQ index, an NDI field, an MCS index, an RV field, precoding information, a TPC field for uplink, other indices or identifiers, other requests, CRC bits, or any combination of these fields. Some of these fields may share similar time criticalness for application in processes at a receiving UE 115, while others may have different time criticalness. The fields may be ranked in priority by the time criticalness for the fields.

For example, a UE 115 may use a field with an associated first priority, such as RB allocation or another field associated with carrier information, during the demodulation front stage for a downlink transmission, which may include demodulation processes up to or including calculating logarithmic-likelihood ratios (LLRs). The UE 115 may use a second field with an associated second priority lower than the first priority, such as MCS index, HARQ index, or another field associated with decoding or rate matching, during later stages of demodulation, which may include demodulation processes occurring after calculating the LLRs. In some cases, the UE 115 may use yet other fields with lower associated priorities than the second priority, such as the TPC for uplink or a sounding reference signal (SRS) request, at even later times (e.g., during a symbol allocated for uplink processing in a downlink-centric self-contained slot). Multi-priority payloads may be used for both DCI transmitted by a base station 105 in the PDCCH and uplink control information (UCI) transmitted by a UE 115 in the physical uplink control channel (PUCCH).

Figure 2:
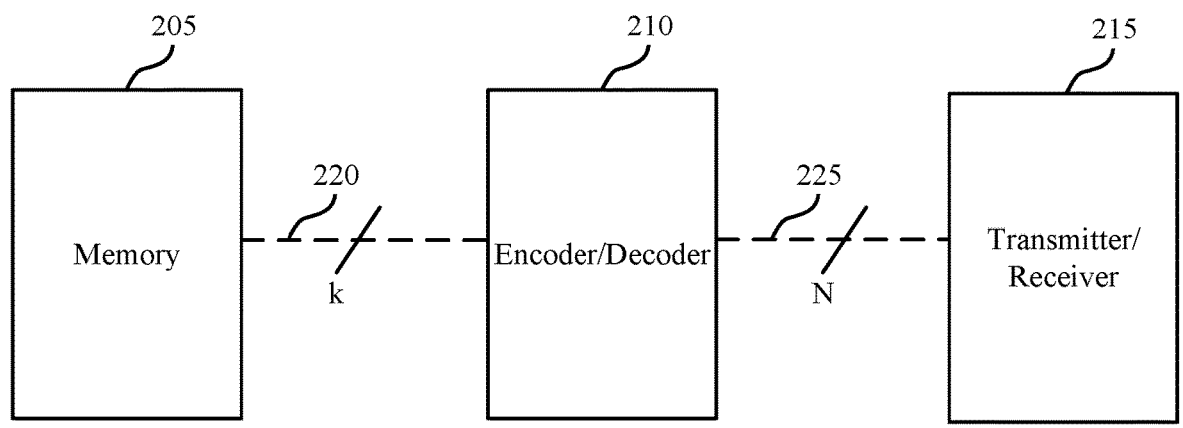
FIG. 2 illustrates an example of a wireless device that supports field prioritization for polar codes in accordance with aspects of the present disclosure.

FIG. 2 illustrates an example of a device 200 that supports field prioritization for polar codes in accordance with various aspects of the present disclosure. The device 200 may be any device within a wireless communications system 100 that performs an encoding or decoding process (e.g., using an error-correcting code). In some cases, such as in 5G NR systems, the error-correcting code may be an example of a polar code. The device 200 may be a UE 115 or base station 105, as described with reference to FIG. 1. In some cases, from the encoding perspective, the device 200 may encode a multi-priority payload into a single codeword. From the decoder perspective, the device 200 may implement efficient handling of multi-priority codewords to improve decoding and signaling latency.

As shown, device 200 includes a memory 205, an encoder/decoder 210, and a transmitter/receiver 215. First bus 220 may connect memory 205 to encoder/decoder 210 and second bus 225 may connect encoder/decoder 210 to transmitter/receiver 215. In some instances, device 200 may have data stored in memory 205 to be transmitted to another device, such as a UE 115 or base station 105. To initiate the transmission process, device 200 may retrieve from memory 205 the data for transmission. The data may include a number of information bits, which may be is or Os, provided from memory 205 to encoder/decoder 210 via first bus 220. The number of information bits may be represented as a value 'k,' as shown. The encoder/decoder 210 may encode the number of information bits and output a codeword having a length 'N,' which may be different than or the same as k. The bits that are not allocated as information bits (i.e., N-k bits) may be assigned as frozen bits or parity bits. In some cases, the information bits may be assigned to the k most reliable bit channels, and the frozen bits may be assigned to the remaining bit channels. Frozen bits may be bits of a default value (0, 1, etc.) known to both the encoder and decoder (i.e., the encoder encoding information bits at a transmitter and the decoder decoding the codeword received at a receiver). Further, from the receiving device perspective, device 200 may receive encoded data via receiver 215, and decode the encoded data using decoder 210 to obtain the transmitted data (e.g., transmitted by transmitter 215 from a different device 200).

In some wireless systems, decoder 210 may be an example of an SC or SC list (SCL) decoder. A UE 115 or base station 105 may receive a transmission including a codeword at receiver 215, and may send the transmission to the SC or SCL decoder (e.g., decoder 210). The decoder 210 may determine input (e.g., unpolarized) LLRs for the bit channels of the received codeword. During decoding, the decoder 210 may determine decoded LLRs based on these input LLRs, where the decoded LLRs correspond to each polarized bit channel of the polar code. These decoded LLRs may be referred to as bit metrics. In some cases, if the LLR is zero or a positive value, the decoder 210 may determine the corresponding bit is a 0 bit, and a negative LLR may correspond to a 1 bit. The decoder 210 may use the bit metrics to determine the decoded bit values.

An SCL decoder may employ multiple concurrent SC decoding processes. Due to the combination of multiple SC decoding processes, the SCL decoder may calculate multiple decoding path candidates. For example, an SCL decoder of list size 'L' (i.e., the SCL decoder performs L SC decoding processes) may calculate L decoding path candidates, and a corresponding reliability metric (e.g., a path metric) for each decoding path candidate. The path metric may represent a reliability of a decoding path candidate or a probability that the corresponding decoding path candidate is the correct set of decoded bits. The path metric may be based on the determined bit metrics and the bit values selected at each bit channel. The SCL decoder may have a number of levels equal to the number of bit channels in the received codeword. At each level, the L decoding path candidates may each be extended with a 0 and a 1 value to generate 2L decoding path candidates. A new set of L decoding path candidates may be selected from the 2L decoding path candidates based on path metrics. For example, the SCL decoder may select the decoding paths with the highest path metrics.

Each SC decoding process may decode the codeword sequentially (e.g., in order of the bit channel indices) due to LLR derivation dependencies. That is, because the first bit channel depends on the input LLRs and no decoded bits, each SC decoding process may first decode the bit corresponding to the first bit channel. Decoding bits for each following bit channel depends on feedback of previously decoded bits. For example, decoding the bit for the second bit channel depends on feedback from decoding the first bit channel, decoding the bit for the third bit channel depends on feedback from decoding the first and second bit channels, etc. In this way, information encoded in bit channels with lower indices may be decoded earlier than information encoded in bit channels with higher indices based on the sequential nature of SC polar decoding.

In order for device 200 (e.g., a decoding device) to decode fields in order of priority, the fields may be organized with respect to priority values within a codeword. For example, an encoder 210 may encode fields containing data with more time criticalness (e.g., with regards to processing at the receiving device) ahead of fields containing data with less time criticalness within the codeword. In some cases, the encoder 210 may partition a CRC or parity check within the codeword. For example, in addition to or instead of including a single CRC or parity check at the end of the codeword, the encoder 210 may include multiple partial CRC or parity checks throughout the codeword. In some cases, the encoder 210 may use a higher number of CRC bits when using this multiple CRC or parity check scheme. The encoder 210 may identify sets of fields with similar priorities, and may include a partial CRC or parity check following each identified set of fields (e.g., within a codeword, a set of high priority fields, such as fields used in the demodulation front stage, may be followed by CRC bits before a set of low priority fields, such as fields used in the demodulation back stage). In some cases, a "field" may refer to the set of DCI or UCI fields, or a single DCI or UCI field (or other fields such as a data field or header in a data communication). For example, the encoder 210 may encode a first field containing one or more DCI or UCI fields, followed by partial CRC or parity check bits, before a second field containing one or more DCI or UCI fields having a lower priority than the DCI or UCI fields of the first field. A decoder 210 at a device 200 (e.g., a receiving device) may perform multiple error checks on the codeword throughout the decoding process. In this way, the decoder 210 may perform pruning or early termination following each identified set of fields, rather than just at the end of decoding. For example, at each CRC or parity check, the decoder 210 may prune any paths that do not pass the check, and may terminate the decoding process early if no paths pass the check.

Based on the prioritized ordering of fields within the codeword, a device 200 decoding the codeword may perform one or more operations using at least a portion of the decoded bits before completing decoding of the entire codeword. After decoding a first set of fields (e.g., the high priority fields), the device 200 may decode a first set of CRC or parity bits. In some cases, the codeword may include an adequate number of CRC or parity bits to meet targeted coding performance thresholds (e.g., a block error rate (BLER) or false-alarm rate (FAR)) for the first set of fields. Based on the first set of CRC or parity bits, the decoder 210 may determine any paths that do not pass the CRC or parity check. The decoder 210 may select, from the surviving paths following the CRC or parity check, the path with the highest path metric. The device 200 may use the bits corresponding to this selected path for processes, such as demodulation front stage processes, while the decoder 210 continues decoding of the codeword. For example, the device 200 may determine a control information parameter for transmission based on the bits of the selected path. The device 200 may provisionally apply the control information parameter for a transmission while the device 200 continues decoding later bits of the codeword. For example, the device 200 may initiate or adjust a modem configuration for transmission based on the determined control information parameter prior to completion of the list decoding process. Such a process may be performed in a short time interval between reception of the codeword and transmissions of a signal based on information encoded in the codeword. In this way, by arranging portions or fields of a codeword according to parameter priorities and by including partial CRC or parity check bits, a decoder 210 may be capable of performing multi-priority signaling throughout the decoding process. In some cases, such multi-priority signaling may result in a decoding latency reduction (e.g., around 50%) for high priority parameters in the codeword.

A possible DCI format for multi-priority signaling in an uplink-centric slot may contain several fields of different priority levels. The DCI format may include the highest priority parameters first, followed by lower priority parameters. For example, the DCI format may include a frequency domain resource allocation (e.g., RB allocation) first in the payload, followed by a first CRC for this first parameter. Following the first CRC, the DCI format may include one or more normal or lower priority parameters. These parameters may include, but are not limited to, an allocation slot offset index, time domain resource allocation, a transmission scheme indicator, one or more indicators for antenna ports or number of layers, precoding information, a HARQ process number, a new data indicator, an MCS index, an RV indicator, a virtual scrambling identity, an indicator of phase tracking reference signal (PTRS) presence, a physical uplink shared channel (PUSCH) mapping on unallocated DMRS, a TPC command for scheduled PUSCH, an SRS request, a channel state information (CSI) transmission offset, a CSI request, a CSI resource indication, or any other control information parameter. In some cases, these parameters may be split into multiple groups, where each group includes parameters with similar priority levels. Each of the groups may be followed by a partial CRC for that group, similar to the first CRC. The DCI format may include a CRC at the end of the payload for performing an error check of the entire payload. A UCI format may similarly be designed to organize fields by time criticalness, with interspersed CRC or parity check bits.

Figure 3:
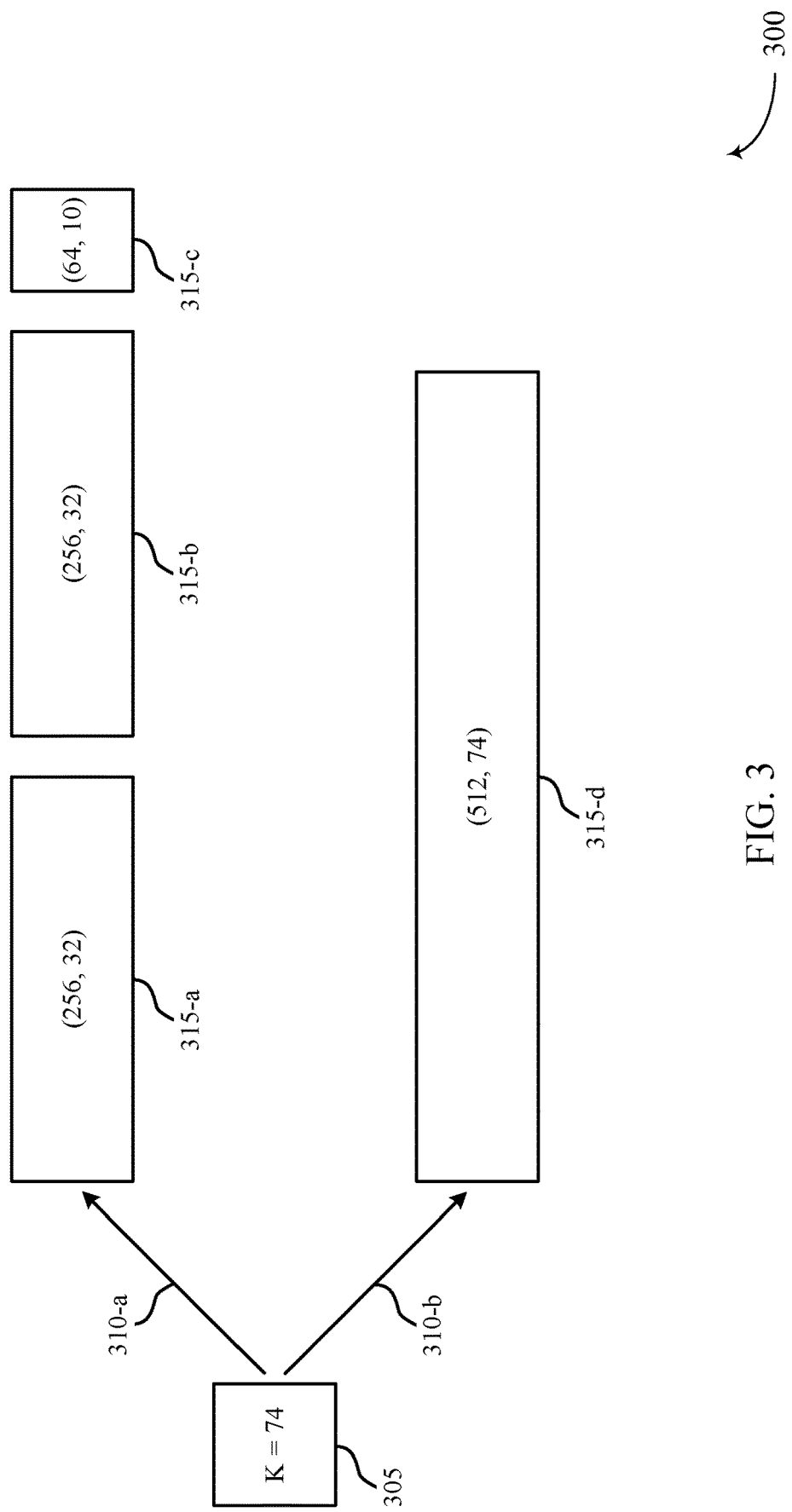
FIG. 3 illustrates an example of codeword generation that supports field prioritization for polar codes in accordance with aspects of the present disclosure.

FIG. 3 illustrates an example of codeword generation 300 that supports field prioritization for polar codes in accordance with various aspects of the present disclosure. Codeword generation 300 illustrates two options for encoding information bits 305 into one or more codewords 315 using a polar code: codeword evenization 310-a and codeword consolidation 310-b. Codeword generation 300 may be performed by a base station 105 or UE 115 as described with reference to FIG. 1, or by a device 200 (e.g., an encoding device) as described with reference to FIG. 2.

A device, such as a base station 105 or UE 115, may have one or more payloads to transmit to a second device. The one or more payloads may contain information bits 305, which may be, for example, 74 information bits. The device may encode the information bits 305, which may correspond to DCI or UCI, for transmission within a single TTI (e.g., a slot) using a polar code.

In certain instances, an encoder may implement codeword evenization 310-a to organize the contents of payloads and manage payload sizes. In some cases, the encoder may identify a default value of information bits, K, and total bits, N, to use in encoding a codeword 315. For example, the default value for the (N, K) pair may be (256, 32). The default value for the (N, K) pair may be based on a timing parameter, a latency threshold, a reliability threshold, or any other parameter or threshold associated with limiting the size of a codeword 315. For example, a smaller codeword 315 may include fewer frozen bits near the beginning of the codeword 315, which may improve decoding latency for one or more fields of the highest priority. If the encoder receives an information vector containing more information bits 'K_all' than the default value K, the encoder may split the K_all information bits into multiple payloads and may encode each payload into a separate codeword. For example, the encoder may encode the first 32 information bits of the 74 total information bits 305 into a first codeword 315-a of length 256. In some cases, these first 32 information bits may include control information fields of the highest priorities. The encoder may also encode partial CRC or parity bits throughout the codeword 315 based on the priority of sets of information bits.

The encoder may continue to encode the information bits 305 into evenized codewords of length N containing K information bits until K bits or less of the initial K_all bits remain for encoding. For example, the encoder may encode the next 32 information bits of the 72 total information bits 305 into evenized codeword 315-b, leaving 10 information bits of the total information bits 305 remaining. In some cases (e.g., when assigning the information bits to the K most reliable channels), codewords 315-a and 315-b with the same (N, K) pair may have their frozen bits assigned to the same channels, and thus may have the same frozen bit pattern. After encoding the evenized codewords 315-a and 315-b, the encoder may then encode the remaining bits into a final codeword 315, which in some cases may have fewer than K information bits, and may be smaller in size than N total bits. For example, the encoder may encode the remaining 10 information bits into codeword 315-c, where codeword 315-c contains 64 total bits. In some cases, all of these codewords 315 (e.g., codeword 315-a, 315-b, and 315-c) may be transmitted in a TTI, such as a slot.

If the encoder splits an information vector (e.g., the information bits 305) into multiple payloads, the encoder may insert supplemental fields into the payload headers. For example, the encoder may add a payload index to each payload, to indicate an order of the payloads. Additionally or alternatively, the encoder may add an even-odd toggling indicator, a continuation indicator, or any other indicator indicating that a payload (e.g., a next payload or the current payload) is part of a series of evenized codewords 315. The encoder may arrange a payload header near the high priority fields in a codeword 315, so that the supplemental fields of the payload header may be decoded early and the information may be used for the rest of the decoding process. In some cases, the encoder may include one or more CRC or parity checks within the payload header, in order to select decoded bits corresponding to the supplemental fields and use the selected decoded bits to begin a decoding process on one or more additional codewords.

When a decoder receives a codeword 315, the decoder may determine the DCI or UCI format used. The decoder may make multiple decode hypotheses to determine the actual DCI or UCI format and the corresponding frozen bit pattern. Evenized codewords 315 may reduce the decoding latency and complexity by limiting the number of decode hypotheses used by the decoder. For example, the decoder may receive first codeword 315-a, and may perform decoding according to multiple decode hypotheses. Successful decoding (e.g., all parity or CRC checks passing) according to one of the decode hypotheses identifies the codeword size and frozen bit pattern associated with the (N, K) pair of the first codeword 315-a. The decoder may then receive second codeword 315-b, and may perform a single blind decode hypothesis based on the previously received codeword size and frozen bit pattern. In some cases, the first codeword 315-a may include one or more supplemental fields indicating a series of evenized codewords 315. For example, the first codeword 315-a may include an indication that the second codeword 315-b exists in a sequence of blind decodes (i.e., the second codeword 315-b conforms to a same format as the first codeword 315-a). The decoder may also perform a CRC or parity check based on a supplemental field and the sequence of blind decodes, and in some cases may perform pruning or early termination based on the check. The decoder may continue to perform blind decoding on a set of codewords 315 until receiving an indication (e.g., in a supplemental field of the payload header) of a final codeword 315 in the blind decoding sequence. Following decoding of the final codeword 315 in the blind decoding sequence, the decoder may revert to performing multiple decode hypotheses when decoding a next codeword 315 (e.g., codeword 315-c). In some cases, the blind decoding sequence may apply to each codeword 315 received in a TTI (e.g., a slot) save for the final codeword 315 of the TTI.

In other instances, an encoder may implement codeword consolidation 310-b to encode a single codeword 315 for all information bits 305 of a TTI (e.g., a slot). For example, if an encoder has multiple payloads to encode for transmission in a single TTI (e.g., if the total information bits 305 are made up of multiple sets of information bits, each set corresponding to a different payload), the encoder may concatenate the multiple payloads into a single joint payload. The encoder may encode the joint payload into a single codeword 315-d. Using single codeword 315-d rather than multiple smaller codewords 315-a, 315-b, and 315-c in the TTI may improve BLER coding performance and may allow a decoder to perform fewer decoding hypotheses. Single codeword 315-d may include multiple partial CRC or parity checks separating sets of fields of different priority levels. In some cases, the encoder may determine whether to encode a single codeword 315 (e.g., consolidated codeword 315-d) or multiple codewords 315 (e.g., evenized codewords 315-a and 315-b, and final codeword 315-c) based on a latency threshold associated with decoding or control signaling. In some cases, if the encoder has fewer information bits to transmit than a default K value, the encoder may implement rate matching for the transmitted codeword to match a coding rate for the default K value.

Figure 4:
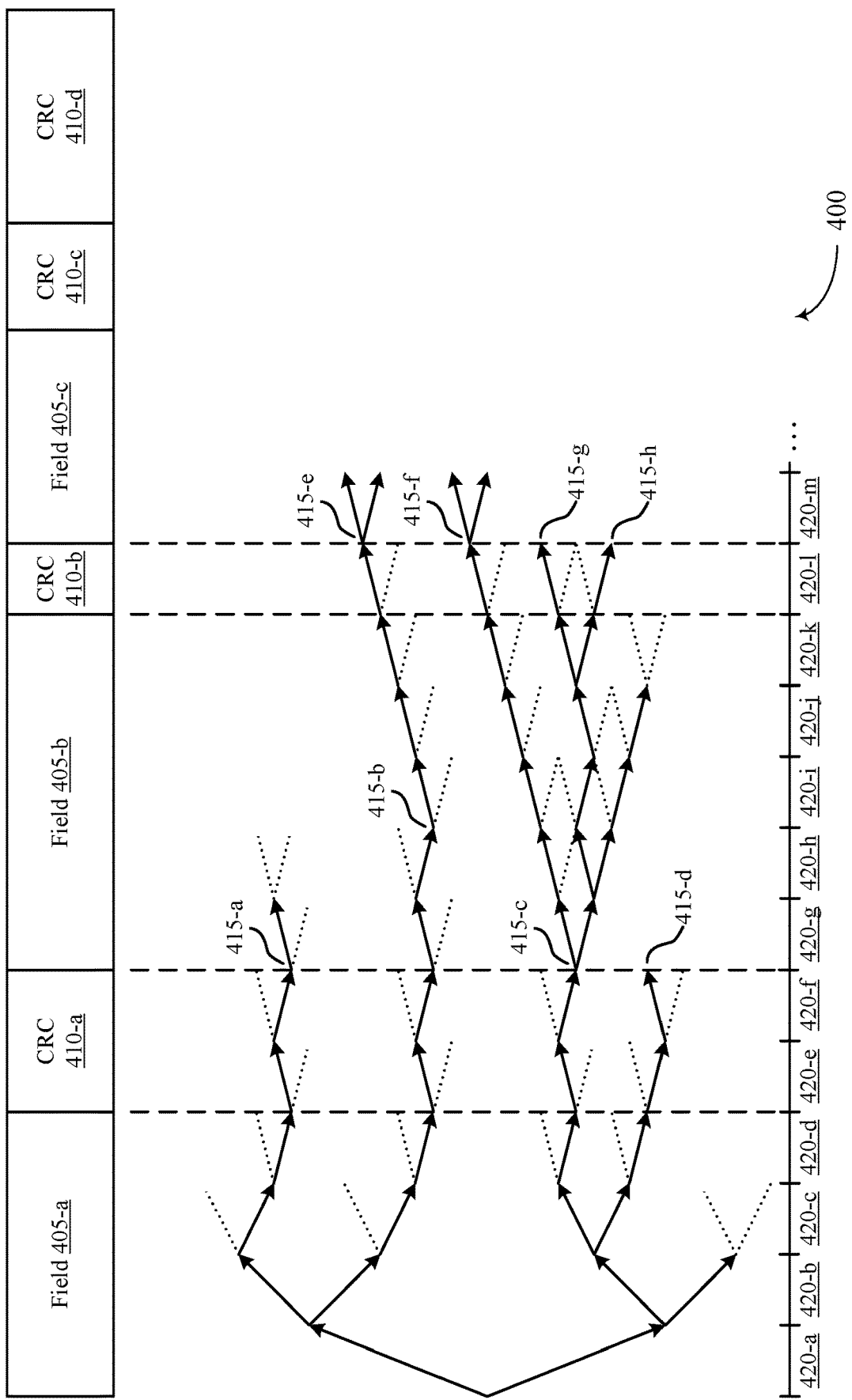
FIG. 4 illustrates an example of a decoding process that supports field prioritization for polar codes in accordance with aspects of the present disclosure.

FIG. 4 illustrates an example of a decoding process 400 (e.g., an SCL decoding process) that supports field prioritization for polar codes in accordance with various aspects of the present disclosure. The decoding process 400 may be performed by a base station 105, a UE 115, or a device 200 as described with reference to FIGS. 1 and 2. For example, the decoding process 400 may be performed by an SCL decoder of list size L=4, with L candidate paths 415. The decoding process 400 may be represented by a binary tree, where each branch in the tree represents assigning a decoded bit to a bit channel for a decoding path. In some cases, each upwards branch may represent assigning a 0 for a bit channel, while the corresponding downward branch may represent assigning a 1 for that bit channel. In these cases, candidate path 415-h may represent the assigned bits 100101101011 for the first twelve information and parity bit channels 420 of the codeword.

In some cases, the decoding process may be an example of decoding bit channels of a multi-priority encoded codeword. The codeword may be organized with high priority fields first, followed by groups of fields in order of decreasing priority. For example, field 405-a may include high priority information (e.g., information used during the demodulation front stage), while field 405-b may include medium priority information (e.g., information used during later stages of demodulation), and field 405-c may include low priority information (e.g., information used following demodulation). Each field 405 may be followed by an error check field 410 (e.g., set of CRC or parity check bits), which may be generated using a function that depends on the bits of the field 405. For example, error check field 410-a may be based on field 405-a, error check field 410-b may be based on field 405-b, and error check field 410-c may be based on field 405-c. The codeword may also include an error check field 410-*d* which may be generated using a function that depends on the bits of all of the fields 405-*a*, 405-*b*, and 405-*c*, and which may be located at the end of the codeword. In some cases, the codeword may not include error check field 410-*c* for a last or lowest priority information portion, and instead the last data field 405-*c* may be followed by the error check field 410-*d* based on the bits for all of the fields in the codeword. The fields 405 and error check fields 410 shown may illustrate an organization of information bits used to encode the codeword, and may not show other aspects of encoding process, such as frozen bit placement.

As an SCL decoder of list size L=4, the decoder may concurrently process (e.g., maintain after processing each information bit) four candidate paths. Following decoding of the first field 405-*a* and error check field 410-*a* at bit channel 420-*f*, the SCL decoder may check for any candidate paths that do not pass the error detecting check. In some examples, the SCL decoder performs path pruning based on the error detecting check. In the example illustrated in FIG. 4, the SCL decoder may prune candidate paths 415 that do not pass a given error check field 410. For example, candidate path 415-*d* may fail the error check function based on the decoded bits for bit channels 420-*a*, 420-*b*, 420-*c*, and 420-*d* of field 405-*a* and bit channels 420-*e* and 420-*f* of error check field 410, and the SCL decoder may prune candidate path 415-*d* at bit channel 420-*f*. Path pruning based on error check fields 410 may be performed before or after path selection based on path metrics. For example, FIG. 4 illustrates path selection based on path metrics to select L=4 paths, then path pruning based on error check field 410 to result in less than L paths being extended to the next bit channel. Alternatively, the error check function may be run on each of the 2L paths generated from bit-channel 420-*f*, with up to L (e.g., the L with the highest path metrics) paths extended past bit-channel 420-*f*.

After performing the error check function based on the error check field 410-*a*, the SCL decoder may then select the surviving candidate path 415 with the highest path metric for early application of decoded bits. The decoded bits for the selected candidate path 415 may be processed by a device (e.g., device 200, as described in FIG. 2) to perform time sensitive functions (e.g., demodulation front stage processes). In this way, the device may begin early provisional application of the decoded bits following decoding of parity bit channel 420-*f* and the corresponding CRC or parity check, while decoding of the codeword may not be completed until a later time.

In one case, the SCL decoder may implement "sticky" decoded bit selection for the early application of decoded bits. For example, the early application of the decoded bits may continue as long as the selected candidate path 415 survives the SCL decoding process 400. For example, the SCL decoder may select candidate path 415-*c* for early application of decoded bits following the first CRC or parity check. In this case, the decoded bits to be used for time sensitive processing may be the decoded bits corresponding to bit channels 420-*a*, 420-*b*, 420-*c*, and 420-*d* for candidate path 415-*c* (e.g., the decoded bits 1001). In some cases, a candidate path 415-*f* that began with the selected candidate path 415-*c* may pass a second partial CRC or parity check (e.g., at CRC field 410-*b*). In some cases, the decoder may send more decoded bits (e.g., the decoded bits corresponding to bit channels 420-*g*, 420-*h*, 420-*i*, 420-*j*, and 420-*k* for candidate path 415-*f*) for early processing by the wireless device.

In some cases, the candidate path 415-*f* stemming from the selected candidate path 415-*c* may have the highest path metric of surviving candidate paths 415 after the second CRC field 410-*b*. In these cases, the decoder may select candidate path 415-*f* for early application of decoded bits. In other cases, a different candidate path 415 (i.e., one that does not stem from the selected candidate path 415-*c*, such as candidate path 415-*e*) may have the highest path metric of surviving candidate paths 415 following the second CRC field 410-*b*. However, in "sticky" decoded bit selection, the decoder may continue the early application of the decoded bits associated with candidate path 415-*c*. The decoder may not select the candidate path 415-*e* with the highest path metric, but instead the candidate path 415-*f* with the highest path metric stemming from the candidate path 415-*c* selected at the first CRC field 410-*a*. In this way, the decoder will "stick" with the candidate path 415 selected at the first CRC field 410-*a* as long as that selected candidate path 415 survives the decoding process.

In a second case, the SCL decoder may implement "non-sticky" decoded bit selection for the early application of decoded bits. In "non-sticky" decoded bit selection, the decoder may revoke early provisional application of decoded bits if, following a second CRC or parity check, a different candidate path 415 is selected based on the path metric. For example, in the case where candidate path 415-*c* is selected after the first CRC or parity check, the decoder may select candidate path 415-*e* following the second CRC or parity check (e.g., candidate path 415-*e* may have the highest path metric of candidate paths 415 that pass the second CRC or parity check). In "non-sticky" decoded bit selection, the decoder may send an indication to other components of the wireless device to re-initiate early provisional application of decoded bits. The wireless device may stop performing processes based on the decoded bits of the candidate path 415-*c* selected at the first CRC field 410-*a*, and may begin processes based on the decoded bits of the candidate path 415-*e* with the highest path metric at the second CRC field 410-*b*.

In a third case, the SCL decoder may implement "multi-engine" decoded bit selection for the early application of decoded bits. In "multi-engine" decoded bit selection, the device may include multiple processing engines. The device may perform early application of different sets of decoded bits on each processing engine. For example, rather than selecting a single candidate path 415 following the second CRC or parity check, the device may continue the early application of one candidate path 415 on one processing engine, and may begin an early application process of decoded bits associated with a different candidate path 415 on a second processing engine. In this way, the device may perform early application of the decoded bits associated with candidate path 415-*c* after the first CRC or parity check on a first processing engine. After the second CRC or parity check, the device may perform early provisional application of the decoded bits associated with candidate path 415-*e* on a second processing engine, while continuing to perform early application of decoded bits on the first engine using the decoded bits associated with candidate path 415-*f* (e.g., the surviving candidate path 415 starting with candidate path 415-*c* with the highest path metric). In some cases, in "multi-engine" decoded bit selection, the decoder may select each candidate path passing a CRC or parity check for early application of decoded bits, regardless of the associated path metrics.

In the above cases, the device may halt early provisional application processes using decoded bits if all candidate paths 415 stemming from the selected candidate path 415 are pruned. For example, if candidate path 415-*a* is selected after the first CRC or parity check, the decoder may send the corresponding bits for information bit channels 420-*a*, 420-*b*, 420-*c*, and 420-*d* to the device to be used in processing. However, all candidate paths 415 stemming from candidate path 415-*a* may be pruned during decoding of information bit channel 420-*h*. When no candidate paths 415 stemming from the candidate path 415-*a* selected at the first error checking field 410-*a* survive, the decoder may send an indication of the decoded bits associated with the surviving candidate path 415 with the highest path metric (e.g., candidate path 415-*b*) to the device. The device may halt processes using the decoded bits associated with candidate path 415-*a* sent to it following the first CRC or parity check, and may begin processes using the decoded bits associated with candidate path 415-*b* (e.g., the decoded bits 0111 corresponding to information bit channels 420-*a*, 420-*b*, 420-*c*, and 420-*d*).

In an alternative to performing path pruning based on the error detecting check, the SCL decoder may not prune paths based on the error detecting check. For example, at bit-channel 420-*f*, path 415-*d* may not be pruned, and path selection of paths 415-*a*, 415-*b*, 415-*c*, and 415-*d* may continue in bit-channels 420 of field 405-*b*. Not performing path pruning based on the error detecting check may reduce the FAR at the expense of a lower detection rate. Sticky, non-sticky, and multi-engine decoded bit selection may be performed whether or not path pruning based on the error detecting check is performed. If path pruning is not performed, at some point during list decoding operations subsequent to the first error checking field 410-*a* (e.g., list decoding operations for bit channels 420-*g*, 420-*h*, etc.), it may be determined that no candidate path 415 that passed the first CRC or parity check continues to survive, in which case the decoding process may be terminated and any early provisional application of decoded bits may be revoked.

Figure 5:
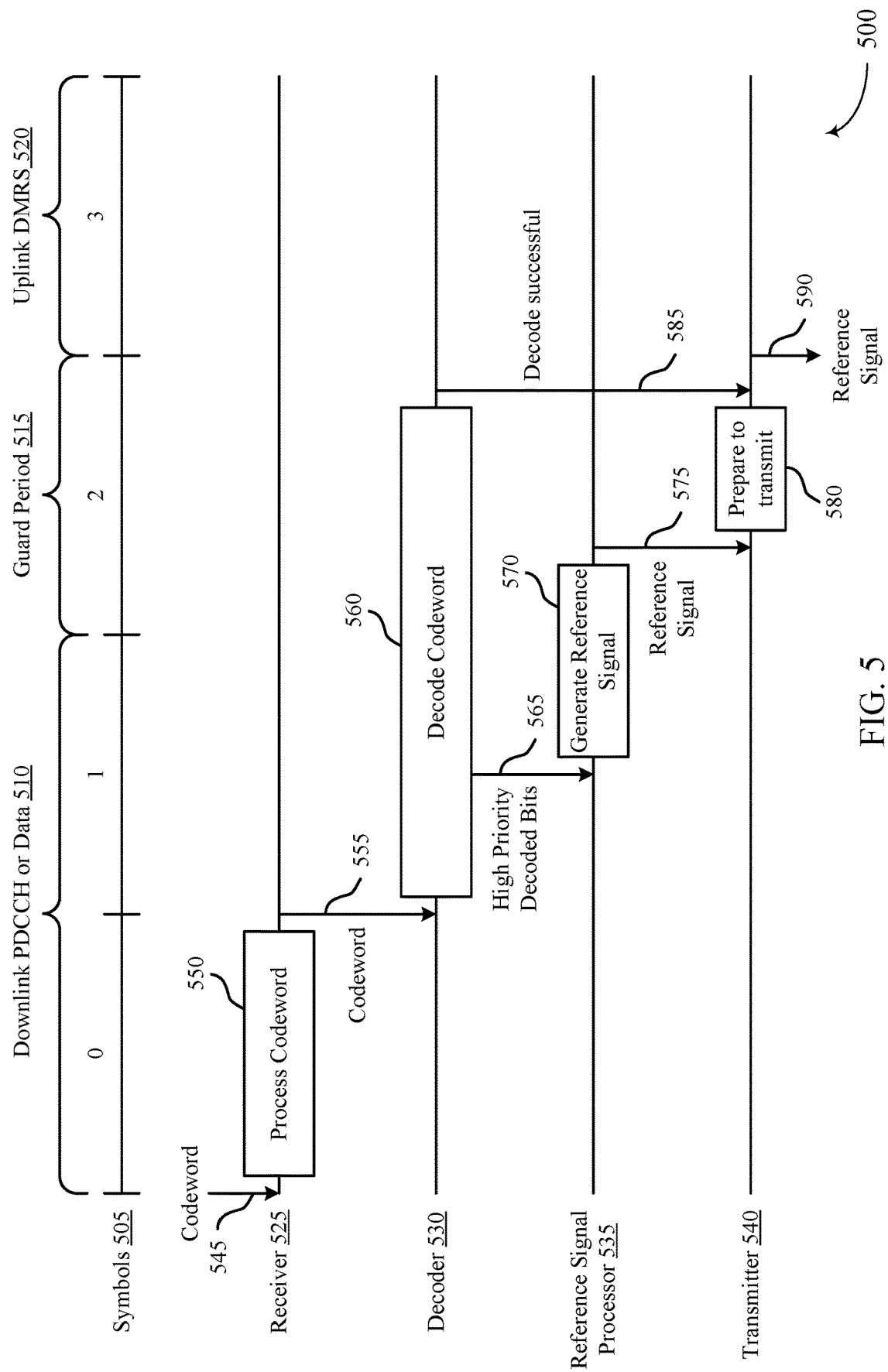
FIG. 5 illustrates an example of a process timeline that supports field prioritization for polar codes in accordance with aspects of the present disclosure.

FIG. 5 illustrates an example of a process timeline 500 that supports field prioritization for polar codes in accordance with various aspects of the present disclosure. Process timeline 500 may include processes performed by a receiver 525, a decoder 530, a reference signal processor 535, and a transmitter 540. The processes may be performed during the first four symbols 505 of a TTI, such as an uplink-centric slot. In some cases, the first two symbols 505 (e.g., symbols 0 and 1) may be reserved for receiving downlink PDCCH messages or downlink data 510, the third symbol 505 (e.g., symbol 2) or a portion of the third symbol 505 may be reserved as a guard period 515 for switching between downlink reception and uplink transmission, and the fourth symbol 505 (e.g., symbol 3) may be reserved for uplink DMRS transmission 520. Process timeline 500 may represent processes performed by a UE 115, as described with reference to FIG. 1. As this is one example of a process timeline 500, other process timelines may be implemented based on different formats for uplink or downlink TTIs. Additionally, transmission, reception, and processing may not occur at the exact times illustrated by process timeline 500, but may instead occur earlier or later depending on lengths of codewords, processing latencies, timing offsets, or any other parameters associated with the processes described below.

At 545, the receiver 525 may receive a codeword containing a DCI payload from a base station 105. In some cases, to meet the latency standards of performing all of these processes within the schedule set by process timeline 500, the base station 105 may implement field prioritization when encoding the codeword. For example, the base station 105 may encode RB group (RBG) allocation to be decoded early on during decoding of the codeword. The receiver 525 may perform reception processing on the codeword at 550, and may send the codeword to the decoder 530 at 555.

At 555, the decoder 530 may receive the codeword, and may begin decoding the codeword at 560. Based on the field prioritization of the codeword, the decoder 530 may decode high priority bits, such as bits corresponding to RBG allocation, early on in the decoding process. The decoder 530 may select decoded bits corresponding to the high priority bits based on a partial CRC or parity check, and may send the high priority decoded bits 565 to the reference signal processor 535.

At 570, the reference signal processor 535 may provisionally apply the high priority decoded bits. For example, the reference signal processor 535 may generate a reference signal based on the received high priority decoded bits 565. For example, the reference signal processor 535 may generate an uplink DMRS based on the RBG allocation corresponding to the high priority decoded bits 565. In some cases, the reference signal processor 535 may perform these functions while the decoder 530 continues decoding the codeword. The reference signal processor 535 may send the generated reference signal to the transmitter 540 at 575.

At 580, the transmitter 540 may prepare to transmit the received reference signal. The transmitter 540 may receive an indication 585 from the decoder 530 that the decoding was successful (e.g., the high priority decoded bits 565 were successfully decoded) upon completion of the decoding process 560. If the decoded bits include other bits for the transmitter, the decoder 530 may send the other bits to the transmitter 540 with the indication 585. The transmitter 540 may then, at 590, transmit the reference signal (e.g., the uplink DMRS) to the base station 105 in the symbol 505 reserved for uplink DMRS transmission 520. In this way, the UE 115 may perform all reception processing of the PDCCH, decoding of the resource allocation portion of the PDCCH, encoding of the uplink DMRS, and transmission of the uplink DMRS between the end of over-the-air reception of symbol 0 and the start of uplink transmission in symbol 3. If, however, upon completion of decoding the decoder 530 determines that the decoding was unsuccessful (e.g., there was no decoding path that successfully passed CRC or no uplink grant encoded in the codeword), the transmitter 540 may then not transmit the reference signal. In addition, even if the decoding was successful (e.g., an uplink grant was detected), but the high priority decoded bits 565 were not correct, the transmitter 540 may then not transmit the reference signal because the generated reference signal is incorrect. In this case, the device may refrain from transmitting on the uplink grant because it is unable to process the codeword and generate the reference signal within the allotted timing. The base station will detect that no transmission was received associated with the uplink grant (e.g., by unsuccessful decode of the uplink transmission), and re-transmit the grant.

Figure 6:
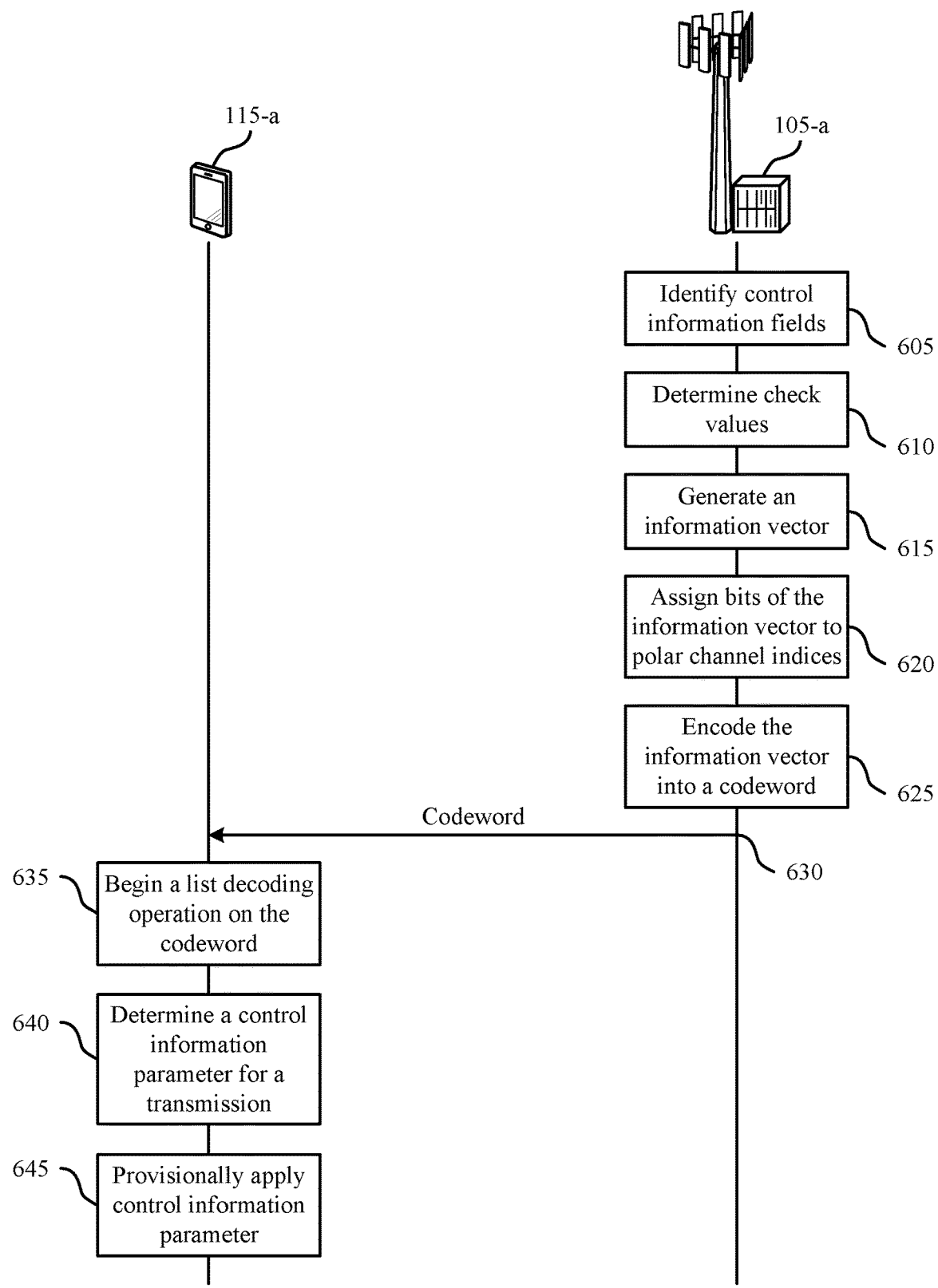
FIG. 6 illustrates an example of a process flow that supports field prioritization for polar codes in accordance with aspects of the present disclosure.

FIG. 6 illustrates a process flow 600 that supports field prioritization for polar codes in accordance with various aspects of the present disclosure. Process flow 600 may include base station 105-*a* and UE 115-*a*, which may be examples of a base station 105 and a UE 115 as described with reference to FIG. 1. Additionally, base station 105-*a* and UE 115-*a* may be examples of a device 200 as described with reference to FIG. 2.

At 605, base station 105-*a* may identify a set of control information fields for encoding using a polar code. The set of control information fields may be associated with control signaling for UE 115-*a*, and may include at least a first field having a first priority and a second field having a second priority that is lower than the first priority. The first field may contain a set of one or more DCI fields or parameters, while the second field may contain a different set of one or more DCI fields of parameters. In some cases, the first field may indicate a frequency domain resource allocation for UE 115-*a*. In other cases, the first field may indicate header information corresponding to the set of control information fields.

At 610, base station 105-*a* may determine check values for the set of control information fields. For example, base station 105-*a* may determine a first partial check value as a function of at least the first field and a combined check value as a function of at least the first field and the second field. In some cases, base station 105-*a* may additionally determine a second partial check value as a function of at least the second field. The first partial check value, second partial check value, and combined check value may all be examples of parity check values or CRC values.

At 615, base station 105-*a* may generate an information vector based on the set of control information fields, the first partial check value, and the combined check value.

At 620, base station 105-*a* may assign bits of the information vector to respective polar channel indices of the polar code. Base station 105-*a* may assign the bits based on a decoding order for the polar code. For example, base station 105-*a* may assign the first field to first polar channel indices with regard to decoding order, followed by the first partial check value, and the second field. The combined check value may follow, with respect to the decoding order, the second field.

At 625, base station 105-*a* may encode the information vector to generate a codeword. For example, the bits may be encoded to their assigned channels, so that the codeword may be decoded according to the decoding order.

At 630, base station 105-*a* may transmit the codeword to UE 115-*a*. In some cases, base station 105-*a* may transmit the codeword on the PDCCH.

At 635, UE 115-*a* may perform a sequential list decoding operation on the codeword, which may be performed in order of bit channel indices of the polar code. UE 115-*a* may determine a number of list decoding paths (e.g., where the number of list decoding paths may be based on a list size of a list decoder used by UE 115-*a*). For each list decoding path, UE 115-*a* may perform an error check process using the first partial check value on a first portion of a representation of the information vector including at least the first field. In some cases, UE 115-*a* may perform further error check processes using the second partial check value or the combined check value on other portions of the representation of the information vector.

At 640, UE 115-*a* may determine a control information parameter for transmission. UE 115-*a* may determine the control information parameter based on a decoding path of the set of list decoding paths that passed the error check process. As discussed above, the UE 115-*a* may use "sticky" path selection, "non-sticky" path selection, or "multi-engine" path selection to determine and/or revoke the control information parameter based on the decoding paths.

At 645, UE 115-*a* may provisionally apply, prior to completion of the sequential list decoding operation on the codeword, the control information parameter for the transmission. For example, UE 115-*a* may initiate a modem configuration for the transmission based on the control information parameter. In some cases, the UE 115-*a* may initiate the modem configuration prior to completion of the list decoding operation. The modem configuration may be associated with a DMRS transmitted by UE 115-*a* in response to receiving the set of control information fields. UE 115-*a* may transmit the DMRS within a predetermined time interval (e.g., three symbols) after receiving the set of control information fields. Alternatively, the modem configuration may be associated with processing resources of a downlink transmission (e.g., sampling or demodulating resources from a downlink resource grant).

Figure 7:
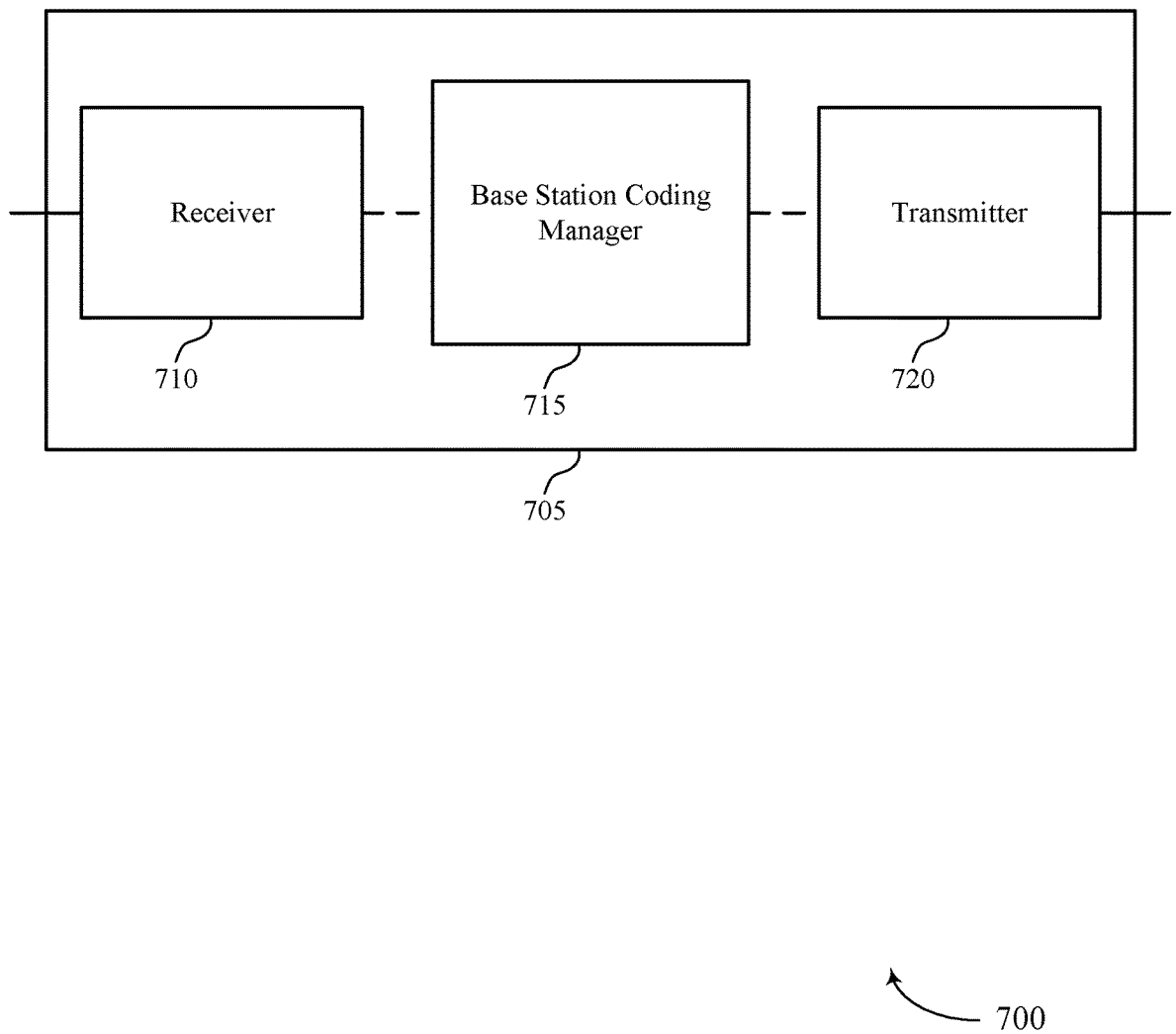
FIGS. 7 through 9 show block diagrams of a device that supports field prioritization for polar codes in accordance with aspects of the present disclosure.

FIG. 7 shows a block diagram 700 of a wireless device 705 that supports field prioritization for polar codes in accordance with aspects of the present disclosure. Wireless device 705 may be an example of aspects of a base station 105 or a device 200 as described herein. Wireless device 705 may include receiver 710, base station coding manager 715, and transmitter 720. Wireless device 705 may also include a processor. Each of these components may be in communication with one another (e.g., via one or more buses).

Receiver 710 may receive information such as packets, user data, or control information associated with various information channels (e.g., control channels, data channels, and information related to field prioritization for polar codes, etc.). Information may be passed on to other components of the device. The receiver 710 may be an example of aspects of the transceiver 1035 described with reference to FIG. 10. The receiver 710 may utilize a single antenna or multiple antennas.

Base station coding manager 715 may be an example of aspects of the base station coding manager 1015 described with reference to FIG. 10. Base station coding manager 715 and/or at least some of its various sub-components may be implemented in hardware, software executed by a processor, firmware, or any combination thereof. If implemented in software executed by a processor, the functions of the base station coding manager 715 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure.

The base station coding manager 715 and/or at least some of its various sub-components may be physically located at various positions, including being distributed such that portions of functions are implemented at different physical locations by one or more physical devices. In some examples, base station coding manager 715 and/or at least some of its various sub-components may be a separate and distinct component in accordance with various aspects of the present disclosure. In other examples, base station coding manager 715 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Base station coding manager 715 may identify a set of control information fields associated with control signaling for a UE for encoding using a polar code, the set of control information fields including a first field having a first priority and a second field having a second priority that is lower than the first priority. Base station coding manager 715 may determine a first partial check value as a function of at least the first field and a combined check value as a function of at least the first field and the second field, and generate an information vector based on the set of control information fields, the first partial check value, and the combined check value. In some cases, base station coding manager 715 may assign bits of the information vector to respective polar channel indices of the polar code based on a decoding order for the polar code, where the first partial check value is assigned to a set of polar channel indices between bits of the first field and bits of the second field according to the decoding order. Base station coding manager 715 may also encode, based on the respective polar channel indices, the information vector to generate a codeword to be decoded according to the decoding order, and transmit the codeword to the UE in a control channel transmission.

Transmitter 720 may transmit signals generated by other components of the device. In some examples, the transmitter 720 may be collocated with a receiver 710 in a transceiver module. For example, the transmitter 720 may be an example of aspects of the transceiver 1035 described with reference to FIG. 10. The transmitter 720 may utilize a single antenna or a set of antennas.

Figure 8:
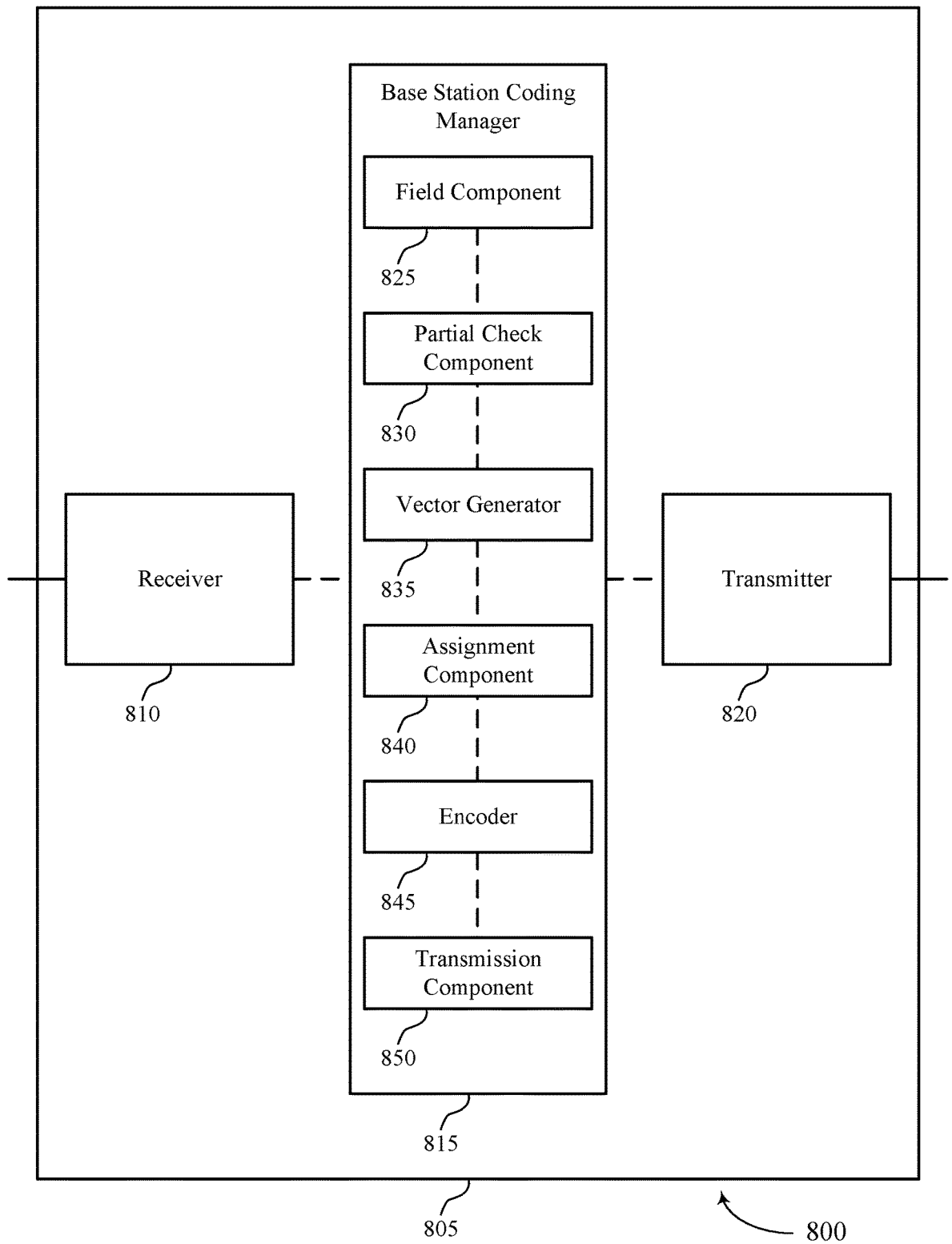

FIG. 8 shows a block diagram 800 of a wireless device 805 that supports field prioritization for polar codes in accordance with aspects of the present disclosure. Wireless device 805 may be an example of aspects of a wireless device 705, a base station 105, or a device 200, as described herein. Wireless device 805 may include receiver 810, base station coding manager 815, and transmitter 820. Wireless device 805 may also include a processor. Each of these components may be in communication with one another (e.g., via one or more buses).

Receiver 810 may receive information such as packets, user data, or control information associated with various information channels (e.g., control channels, data channels, and information related to field prioritization for polar codes, etc.). Information may be passed on to other components of the device. The receiver 810 may be an example of aspects of the transceiver 1035 described with reference to FIG. 10. The receiver 810 may utilize a single antenna or a set of antennas.

Base station coding manager 815 may be an example of aspects of the base station coding manager 1015 described with reference to FIG. 10. Base station coding manager 815 may also include field component 825, partial check component 830, vector generator 835, assignment component 840, encoder 845, and transmission component 850.

Field component 825 may identify a set of control information fields associated with control signaling for a UE for encoding using a polar code, the set of control information fields including a first field having a first priority and a second field having a second priority that is lower than the first priority. In some cases, the set of control information fields includes a third field having a third priority that is lower than the second priority, and where the second set of polar channel indices is between bits of the second field and bits of the third field. In some examples, the first field indicates a frequency domain resource allocation for the UE. In some aspects, the first field indicates header information corresponding to the set of control information fields.

Partial check component 830 may determine a first partial check value as a function of at least the first field and a combined check value as a function of at least the first field and the second field. Partial check component 830 may generate a second partial check value as a function of at least the second field, where the second partial check value is assigned to a second set of polar channel indices between bits of the second field and bits of the combined check value.

In some cases, the first partial check value and the combined check value each include one of a parity check value or a CRC value.

Vector generator 835 may generate an information vector based on the set of control information fields, the first partial check value, and the combined check value. Vector generator 835 may generate a second information vector including at least a third field of the set of control information fields, where the information vector includes an indication for the second information vector. In some cases, vector generator 835 may generate a third information vector including at least a last field of the set of control information fields. In some examples, the information vector and the second information vector are a same size.

Assignment component 840 may assign bits of the information vector to respective polar channel indices of the polar code based on a decoding order for the polar code, where the first partial check value is assigned to a set of polar channel indices between bits of the first field and bits of the second field according to the decoding order.

Encoder 845 may encode, based on the respective polar channel indices, the information vector to generate a codeword to be decoded according to the decoding order. In some examples, encoder 845 may encode the second information vector to generate a second codeword, where the transmitting includes transmitting the second codeword to the UE in the control channel transmission. Encoder 845 may encode the third information vector to generate a third codeword including a different number of bits than the codeword and the second codeword, where the transmitting includes transmitting the third codeword to the UE in the control channel transmission. In some cases, the codeword and the second codeword are a same size.

Transmission component 850 may transmit the codeword to the UE in a control channel transmission and transmit, to the UE, the codeword via a PDCCH message.

Transmitter 820 may transmit signals generated by other components of the device. In some examples, the transmitter 820 may be collocated with a receiver 810 in a transceiver module. For example, the transmitter 820 may be an example of aspects of the transceiver 1035 described with reference to FIG. 10. The transmitter 820 may utilize a single antenna or a set of antennas.

Figure 9:
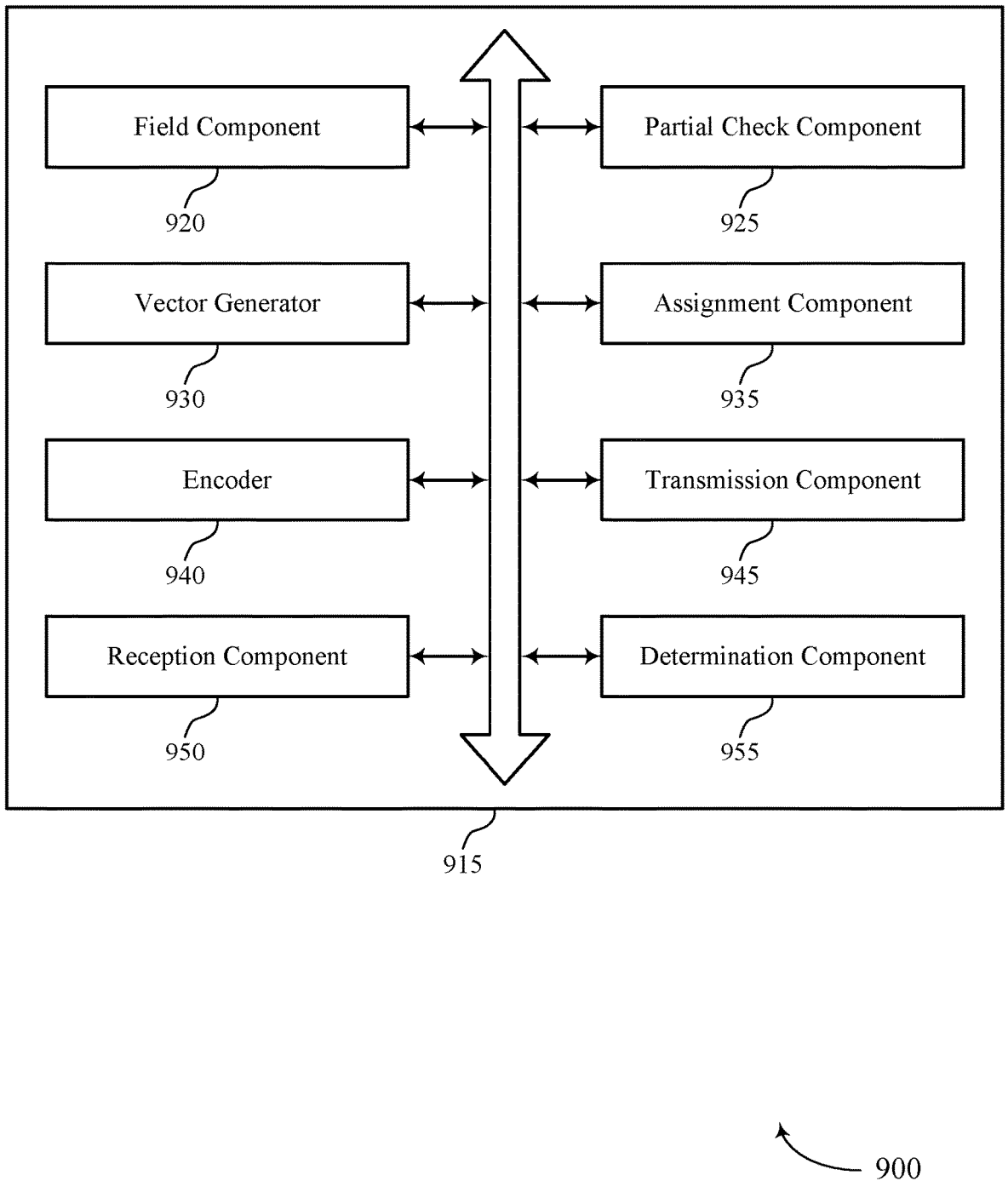

FIG. 9 shows a block diagram 900 of a base station coding manager 915 that supports field prioritization for polar codes in accordance with aspects of the present disclosure. The base station coding manager 915 may be an example of aspects of a base station coding manager 715, a base station coding manager 815, or a base station coding manager 1015 described with reference to FIGS. 7, 8, and 10. The base station coding manager 915 may include field component 920, partial check component 925, vector generator 930, assignment component 935, encoder 940, transmission component 945, reception component 950, and determination component 955. Each of these modules may communicate, directly or indirectly, with one another (e.g., via one or more buses).

Field component 920 may identify a set of control information fields associated with control signaling for a UE for encoding using a polar code, the set of control information fields including a first field having a first priority and a second field having a second priority that is lower than the first priority. In some cases, the set of control information fields includes a third field having a third priority that is lower than the second priority, and where the second set of polar channel indices is between bits of the second field and bits of the third field. In some examples, the first field indicates a frequency domain resource allocation for the UE. In some aspects, the first field indicates header information corresponding to the set of control information fields.

Partial check component 925 may determine a first partial check value as a function of at least the first field and a combined check value as a function of at least the first field and the second field. Partial check component 925 may generate a second partial check value as a function of at least the second field, where the second partial check value is assigned to a second set of polar channel indices between bits of the second field and bits of the combined check value. In some cases, the first partial check value and the combined check value each include one of a parity check value or a CRC value.

Vector generator 930 may generate an information vector based on the set of control information fields, the first partial check value, and the combined check value. Vector generator 930 may generate a second information vector including at least a third field of the set of control information fields, where the information vector includes an indication for the second information vector. In some examples, vector generator 930 may generate a third information vector including at least a last field of the set of control information fields. In some cases, the information vector and the second information vector are a same size.

Assignment component 935 may assign bits of the information vector to respective polar channel indices of the polar code based on a decoding order for the polar code, where the first partial check value is assigned to a set of polar channel indices between bits of the first field and bits of the second field according to the decoding order.

Encoder 940 may encode, based on the respective polar channel indices, the information vector to generate a codeword to be decoded according to the decoding order. Encoder 940 may encode the second information vector to generate a second codeword, where the transmitting includes transmitting the second codeword to the UE in the control channel transmission. In some examples, the encoder 940 may encode the third information vector to generate a third codeword including a different number of bits than the codeword and the second codeword, where the transmitting includes transmitting the third codeword to the UE in the control channel transmission. In some cases, the codeword and the second codeword are a same size.

Transmission component 945 may transmit the codeword to the UE in a control channel transmission and transmit, to the UE, the codeword via a PDCCH message.

Reception component 950 may receive, in response to the PDCCH message, a DMRS from the UE transmitted based on information indicated by the first field, where the DMRS is received within a predetermined time interval after transmission of the codeword. In some cases, the predetermined time interval is three symbols.

Determination component 955 may determine, based on a latency threshold associated with the control signaling, whether to divide the set of control information fields into a set of information vectors for encoding into a set of codewords of a first size or to consolidate the set of control information fields into a single information vector for encoding into a single codeword of a second size, the second size being larger than the first size.

Figure 10:
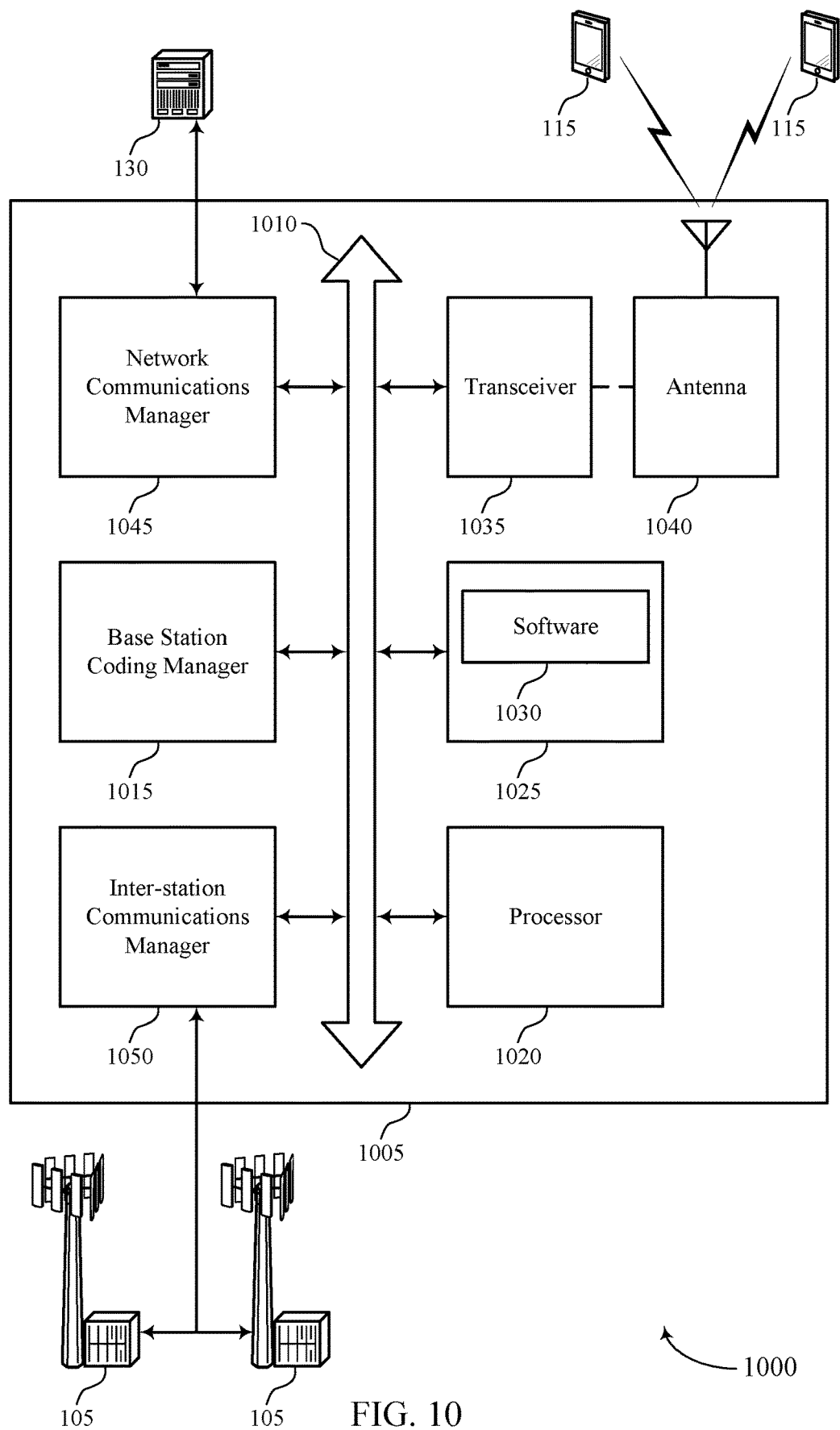
FIG. 10 illustrates a block diagram of a system including a base station that supports field prioritization for polar codes in accordance with aspects of the present disclosure.

FIG. 10 shows a diagram of a system 1000 including a device 1005 that supports field prioritization for polar codes in accordance with aspects of the present disclosure. Device 1005 may be an example of or include the components of wireless device 705, wireless device 805, a base station 105, or a device 200 as described herein. Device 1005 may include components for bi-directional voice and data communications including components for transmitting and receiving communications, including base station coding manager 1015, processor 1020, memory 1025, software 1030, transceiver 1035, antenna 1040, network communications manager 1045, and inter-station communications manager 1050. These components may be in electronic communication via one or more buses (e.g., bus 1010). Device 1005 may communicate wirelessly with one or more UEs 115.

Processor 1020 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1020 may be configured to operate a memory array using a memory controller. In other cases, a memory controller may be integrated into processor 1020. Processor 1020 may be configured to execute computer-readable instructions stored in a memory to perform various functions (e.g., functions or tasks supporting field prioritization for polar codes).

Memory 1025 may include random access memory (RAM) and read only memory (ROM). The memory 1025 may store computer-readable, computer-executable software 1030 including instructions that, when executed, cause the processor to perform various functions described herein. In some cases, the memory 1025 may contain, among other things, a basic input/output system (BIOS) which may control basic hardware or software operation such as the interaction with peripheral components or devices.

Software 1030 may include code to implement aspects of the present disclosure, including code to support field prioritization for polar codes. Software 1030 may be stored in a non-transitory computer-readable medium such as system memory or other memory. In some cases, the software 1030 may not be directly executable by the processor but may cause a computer (e.g., when compiled and executed) to perform functions described herein.

Transceiver 1035 may communicate bi-directionally, via one or more antennas, wired, or wireless links as described above. For example, the transceiver 1035 may represent a wireless transceiver and may communicate bi-directionally with another wireless transceiver. The transceiver 1035 may also include a modem to modulate the packets and provide the modulated packets to the antennas for transmission, and to demodulate packets received from the antennas.

In some cases, the wireless device may include a single antenna 1040. However, in some cases the device may have more than one antenna 1040, which may be capable of concurrently transmitting or receiving multiple wireless transmissions.

Network communications manager 1045 may manage communications with the core network (e.g., via one or more wired backhaul links). For example, the network communications manager 1045 may manage the transfer of data communications for client devices, such as one or more UEs 115.

Inter-station communications manager 1050 may manage communications with other base station 105, and may include a controller or scheduler for controlling communications with UEs 115 in cooperation with other base stations 105. For example, the inter-station communications manager 1050 may coordinate scheduling for transmissions to UEs 115 for various interference mitigation techniques such as beamforming or joint transmission. In some examples, inter-station communications manager 1050 may provide an X2 interface within an LTE/LTE-A or NR wireless communication network technology to provide communication between base stations 105.

Figure 11:
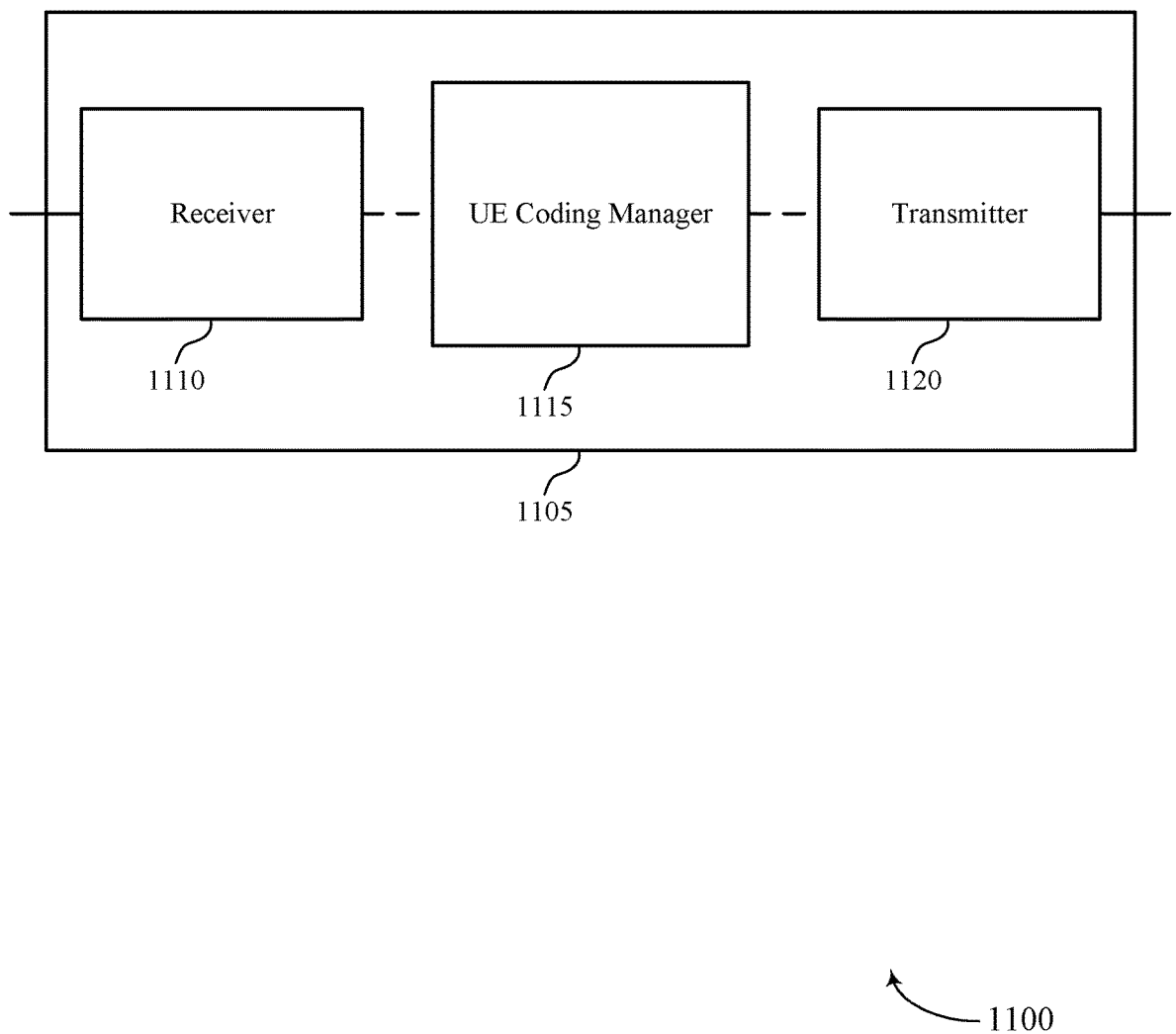
FIGS. 11 through 13 show block diagrams of a device that supports field prioritization for polar codes in accordance with aspects of the present disclosure.

FIG. 11 shows a block diagram 1100 of a wireless device 1105 that supports field prioritization for polar codes in accordance with aspects of the present disclosure. Wireless device 1105 may be an example of aspects of a UE 115 or a device 200 as described herein. Wireless device 1105 may include receiver 1110, UE coding manager 1115, and transmitter 1120. Wireless device 1105 may also include a processor. Each of these components may be in communication with one another (e.g., via one or more buses).

Receiver 1110 may receive information such as packets, user data, or control information associated with various information channels (e.g., control channels, data channels, and information related to field prioritization for polar codes, etc.). Information may be passed on to other components of the device. The receiver 1110 may be an example of aspects of the transceiver 1435 described with reference to FIG. 14. The receiver 1110 may utilize a single antenna or a set of antennas.

UE coding manager 1115 may be an example of aspects of the UE coding manager 1415 described with reference to FIG. 14. UE coding manager 1115 and/or at least some of its various sub-components may be implemented in hardware, software executed by a processor, firmware, or any combination thereof. If implemented in software executed by a processor, the functions of the UE coding manager 1115 and/or at least some of its various sub-components may be executed by a general-purpose processor, a DSP, an ASIC, an FPGA or other programmable logic device, discrete gate or transistor logic, discrete hardware components, or any combination thereof designed to perform the functions described in the present disclosure.

The UE coding manager 1115 and/or at least some of its various sub-components may be physically located at various positions, including being distributed such that portions of functions are implemented at different physical locations by one or more physical devices. In some examples, UE coding manager 1115 and/or at least some of its various sub-components may be a separate and distinct component in accordance with various aspects of the present disclosure. In other examples, UE coding manager 1115 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

UE coding manager 1115 may receive, at a UE, a codeword encoded using a polar code, the codeword generated based on an information vector including a set of control information fields including a first field having a first priority and a second field having a second priority that is lower than the first priority, a first partial check value determined as a function of at least the first field, and a combined check value determined as a function of at least the first field and the second field. UE coding manager 1115 may perform a sequential list decoding operation on the codeword in order of bit channel indices of the polar code, where performing the list decoding operation includes performing, for a plurality of list decoding paths, an error check process using the first partial check value on first respective partial representations of the information vector comprising at least the first field. In some examples, UE coding manager 1115 may determine a control information parameter for a transmission associated with the UE based at least in part on a decoding path of the plurality of list decoding paths having a first respective partial representation of the information vector that passes the error check process, and provisionally apply, prior to completion of the sequential list decoding operation on the codeword, the control information parameter for the transmission. For example, UE coding manager 1115 may initiate, prior to completion of the list decoding operation on the codeword, a modem configuration for the transmission based on the control information parameter.

Transmitter 1120 may transmit signals generated by other components of the device. In some examples, the transmitter 1120 may be collocated with a receiver 1110 in a transceiver module. For example, the transmitter 1120 may be an example of aspects of the transceiver 1435 described with reference to FIG. 14. The transmitter 1120 may utilize a single antenna or a set of antennas.

Figure 12:
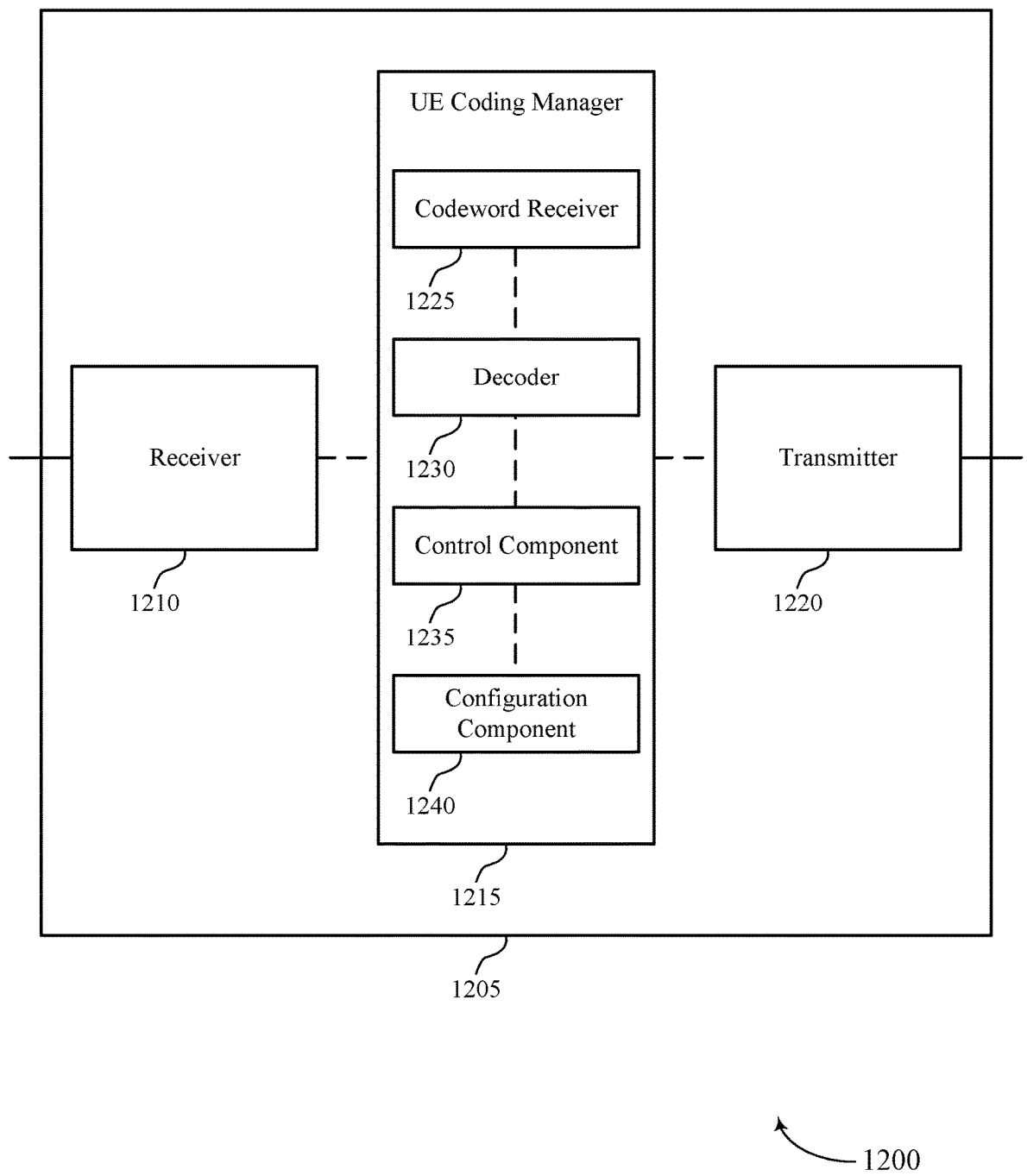

FIG. 12 shows a block diagram 1200 of a wireless device 1205 that supports field prioritization for polar codes in accordance with aspects of the present disclosure. Wireless device 1205 may be an example of aspects of a wireless device 1105, a UE 115, or a device 200 as described herein. Wireless device 1205 may include receiver 1210, UE coding manager 1215, and transmitter 1220. Wireless device 1205 may also include a processor. Each of these components may be in communication with one another (e.g., via one or more buses).

Receiver 1210 may receive information such as packets, user data, or control information associated with various information channels (e.g., control channels, data channels, and information related to field prioritization for polar codes). Information may be passed on to other components of the device. The receiver 1210 may be an example of aspects of the transceiver 1435 described with reference to FIG. 14. The receiver 1210 may utilize a single antenna or a set of antennas.

UE coding manager 1215 may be an example of aspects of the UE coding manager 1415 described with reference to FIG. 14. UE coding manager 1215 may also include codeword receiver 1225, decoder 1230, control component 1235, and configuration component 1240.

Codeword receiver 1225 may receive, at a UE, a codeword encoded using a polar code, the codeword generated based on an information vector including a set of control information fields including a first field having a first priority and a second field having a second priority that is lower than the first priority, a first partial check value determined as a function of at least the first field, and a combined check value determined as a function of at least the first field and the second field. Codeword receiver 1225 may receive a second codeword encoded using the polar code, the second codeword generated based on a second information vector including at least one of the set of control information fields. In some cases, the codeword and the second codeword include a same number of bits. In some examples, the first field indicates a frequency domain resource allocation for the UE. Decoder 1230 may perform a sequential list decoding operation on the codeword in order of bit channel indices of the polar code, wherein performing the sequential list decoding operation includes performing, for a plurality of list decoding paths, an error check process using the first partial check value on first respective partial representations of the information vector comprising at least the first field. Decoder 1230 may perform a second sequential list decoding operation on the second codeword to obtain the at least one of the set of control information fields. In some cases, performing the sequential list decoding operation includes: performing, for the plurality of list decoding paths, a second error check process on second respective partial representations of the information vector for the plurality of list decoding paths using a second partial check value, the second respective partial representations of the information vector being subsequent to the first respective partial representations of the information vector according to the order of bit channel indices of the polar code.

Control component 1235 may determine a control information parameter for a transmission associated with the UE based at least in part on a decoding path of the plurality of list decoding paths having a first respective partial representation of the information vector that passes the error check process. Control component 1235 may provisionally apply, prior to completion of the sequential list decoding operation on the codeword, the control information parameter for the transmission. Control component 1235 may revoke the provisional application of the control information parameter for the transmission based at least in part on a failure of the second error check process for the decoding path.

Configuration component 1240 may provisionally apply, prior to completion of the sequential list decoding operation on the codeword, the control information parameter for the transmission. For example, configuration component 1240 may initiate, prior to completion of the sequential list decoding operation on the codeword, a modem configuration for the transmission based on the control information parameter. In some cases, configuration component 1240 may revoke the provisional application of the control information parameter for the transmission based on a failure of the second error check process for the decoding path. In some cases, the modem configuration is associated with a DMRS transmitted by the UE in response to receiving the set of control information fields, where the DMRS is to be transmitted within a predetermined time interval after receiving the set of control information fields. In some examples, the predetermined time interval includes three symbols.

Transmitter 1220 may transmit signals generated by other components of the device. In some examples, the transmitter 1220 may be collocated with a receiver 1210 in a transceiver module. For example, the transmitter 1220 may be an example of aspects of the transceiver 1435 described with reference to FIG. 14. The transmitter 1220 may utilize a single antenna or a set of antennas.

Figure 13:
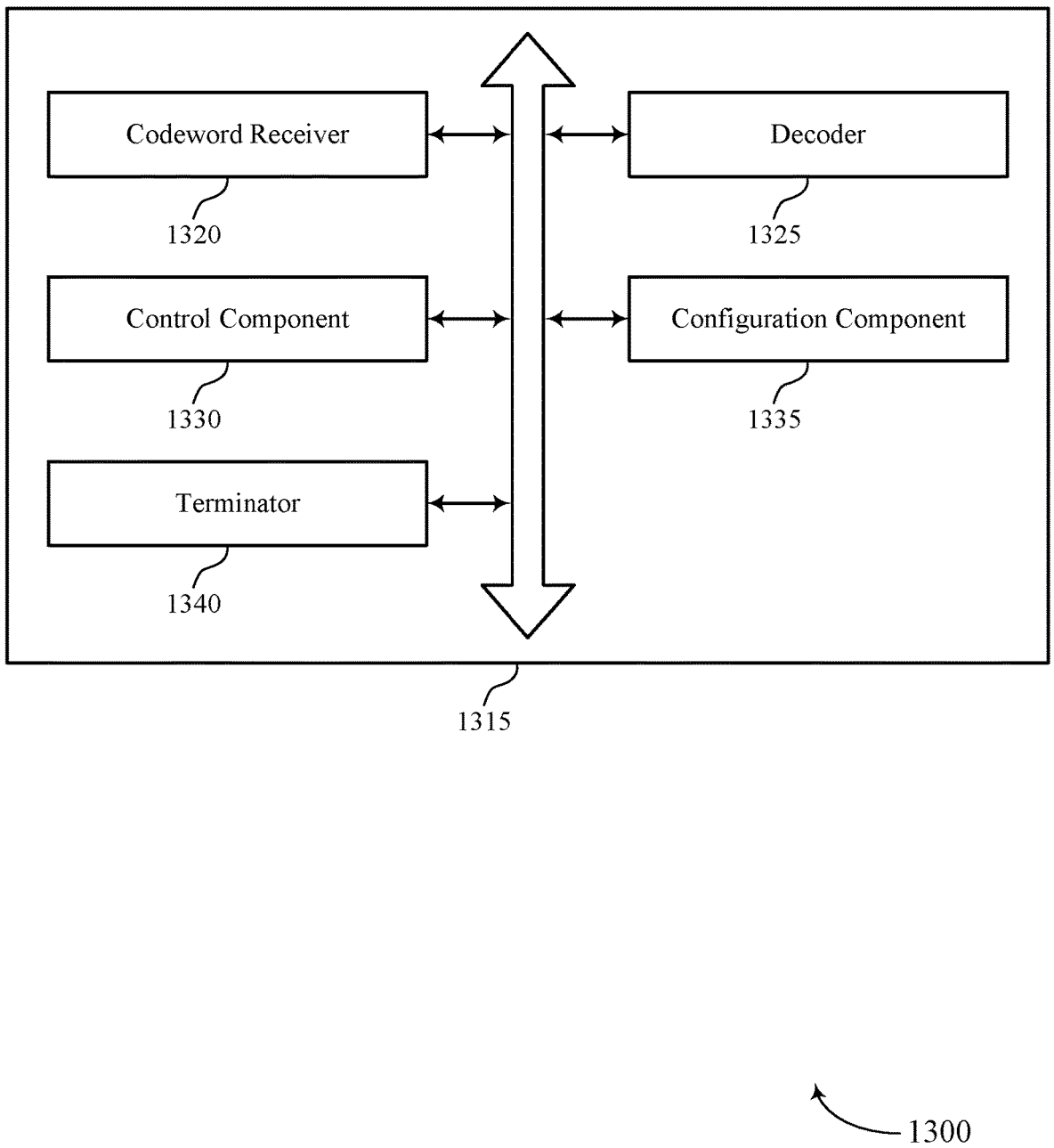

FIG. 13 shows a block diagram 1300 of a UE coding manager 1315 that supports field prioritization for polar codes in accordance with aspects of the present disclosure. The UE coding manager 1315 may be an example of aspects of a UE coding manager 1415 described with reference to FIGS. 11, 12, and 14. The UE coding manager 1315 may include codeword receiver 1320, decoder 1325, control component 1330, configuration component 1335, and terminator 1340. Each of these modules may communicate, directly or indirectly, with one another (e.g., via one or more buses).

Codeword receiver 1320 may receive, at a UE, a codeword encoded using a polar code, the codeword generated based on an information vector including a set of control information fields including a first field having a first priority and a second field having a second priority that is lower than the first priority, a first partial check value determined as a function of at least the first field, and a combined check value determined as a function of at least the first field and the second field. Codeword receiver 1320 may receive a second codeword encoded using the polar code, the second codeword generated based on a second information vector including at least one of the set of control information fields. In some cases, the codeword and the second codeword include a same number of bits. In some examples, the first field indicates a frequency domain resource allocation for the UE.

Decoder 1325 may perform a sequential list decoding operation on the codeword in order of bit channel indices of the polar code, wherein performing the sequential list decoding operation includes performing, for a plurality of list decoding paths, an error check process using the first partial check value on first respective partial representations of the information vector comprising at least the first field. Decoder 1325 may perform a second sequential list decoding operation on the second codeword to obtain the at least one of the set of control information fields. In some cases, performing the sequential list decoding operation includes: performing, for the plurality of list decoding paths, a second error check process on second respective partial representations of the information vector for the plurality of list decoding paths using a second partial check value, the second respective partial representations of the information vector being subsequent to the first respective partial representations of the information vector according to the order of bit channel indices of the polar code.

Control component 1330 may determine a control information parameter for a transmission associated with the UE based at least in part on a decoding path of the plurality of list decoding paths having a first respective partial representation of the information vector that passes the error check process.

Configuration component 1335 may provisionally apply, prior to completion of the sequential list decoding operation on the codeword, the control information parameter for the transmission. For example, configuration component 1335 may initiate, prior to completion of the sequential list decoding operation on the codeword, a modem configuration for the transmission based on the control information parameter. In some cases, configuration component 1335 may revoke the provisional application of the control information parameter for the transmission based on a failure of the second error check process for the decoding path. In some cases, the modem configuration is associated with a DMRS transmitted by the UE in response to receiving the set of control information fields, where the DMRS is to be transmitted within a predetermined time interval after receiving the set of control information fields. In some examples, the predetermined time interval includes three symbols.

Terminator 1340 may terminate, prior to completion of the sequential list decoding operation on the codeword, the sequential list decoding operation based at least in part on a failure of the second error check process for the decoding path. Terminator 1340 may terminate, prior to completion of the sequential list decoding operation on the codeword, the sequential list decoding operation based at least in part on a failure of the second error check process for all of the plurality of decoding paths.

Figure 14:
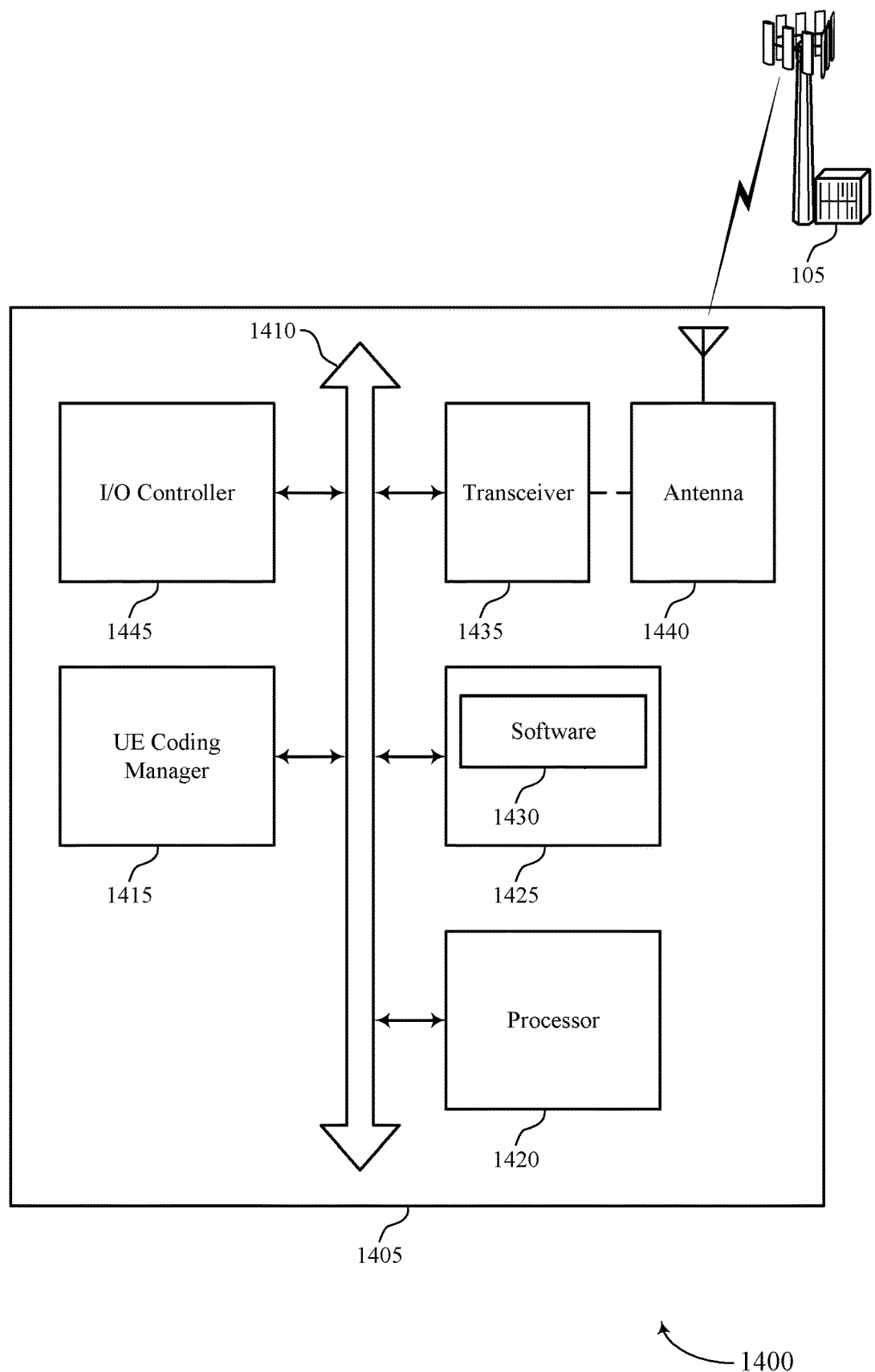
FIG. 14 illustrates a block diagram of a system including a user equipment (UE) that supports field prioritization for polar codes in accordance with aspects of the present disclosure.

FIG. 14 shows a diagram of a system 1400 including a device 1405 that supports field prioritization for polar codes in accordance with aspects of the present disclosure. Device 1405 may be an example of or include the components of UE 115 or device 200 as described herein. Device 1405 may include components for bi-directional voice and data communications including components for transmitting and receiving communications, including UE coding manager 1415, processor 1420, memory 1425, software 1430, transceiver 1435, antenna 1440, and I/O controller 1445. These components may be in electronic communication via one or more buses (e.g., bus 1410). Device 1405 may communicate wirelessly with one or more base stations 105.

Processor 1420 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 1420 may be configured to operate a memory array using a memory controller. In other cases, a memory controller may be integrated into processor 1420. Processor 1420 may be configured to execute computer-readable instructions stored in a memory to perform various functions (e.g., functions or tasks supporting field prioritization for polar codes).

Memory 1425 may include RAM and ROM. The memory 1425 may store computer-readable, computer-executable software 1430 including instructions that, when executed, cause the processor to perform various functions described herein. In some cases, the memory 1425 may contain, among other things, a BIOS which may control basic hardware or software operation such as the interaction with peripheral components or devices.

Software 1430 may include code to implement aspects of the present disclosure, including code to support field prioritization for polar codes. Software 1430 may be stored in a non-transitory computer-readable medium such as system memory or other memory. In some cases, the software 1430 may not be directly executable by the processor but may cause a computer (e.g., when compiled and executed) to perform functions described herein.

Transceiver 1435 may communicate bi-directionally, via one or more antennas, wired, or wireless links as described above. For example, the transceiver 1435 may represent a wireless transceiver and may communicate bi-directionally with another wireless transceiver. The transceiver 1435 may also include a modem to modulate the packets and provide the modulated packets to the antennas for transmission, and to demodulate packets received from the antennas.

In some cases, the wireless device may include a single antenna 1440. However, in some cases the device may have more than one antenna 1440, which may be capable of concurrently transmitting or receiving multiple wireless transmissions.

I/O controller 1445 may manage input and output signals for device 1405. I/O controller 1445 may also manage peripherals not integrated into device 1405. In some cases, I/O controller 1445 may represent a physical connection or port to an external peripheral. In some cases, I/O controller 1445 may utilize an operating system such as iOS®, ANDROID®, MS-DOS®, MS-WINDOWS®, OS/2®, UNIX®, LINUX®, or another known operating system. In other cases, I/O controller 1445 may represent or interact with a modem, a keyboard, a mouse, a touchscreen, or a similar device. In some cases, I/O controller 1445 may be implemented as part of a processor. In some cases, a user may interact with device 1405 via I/O controller 1445 or via hardware components controlled by I/O controller 1445.

Figure 15:
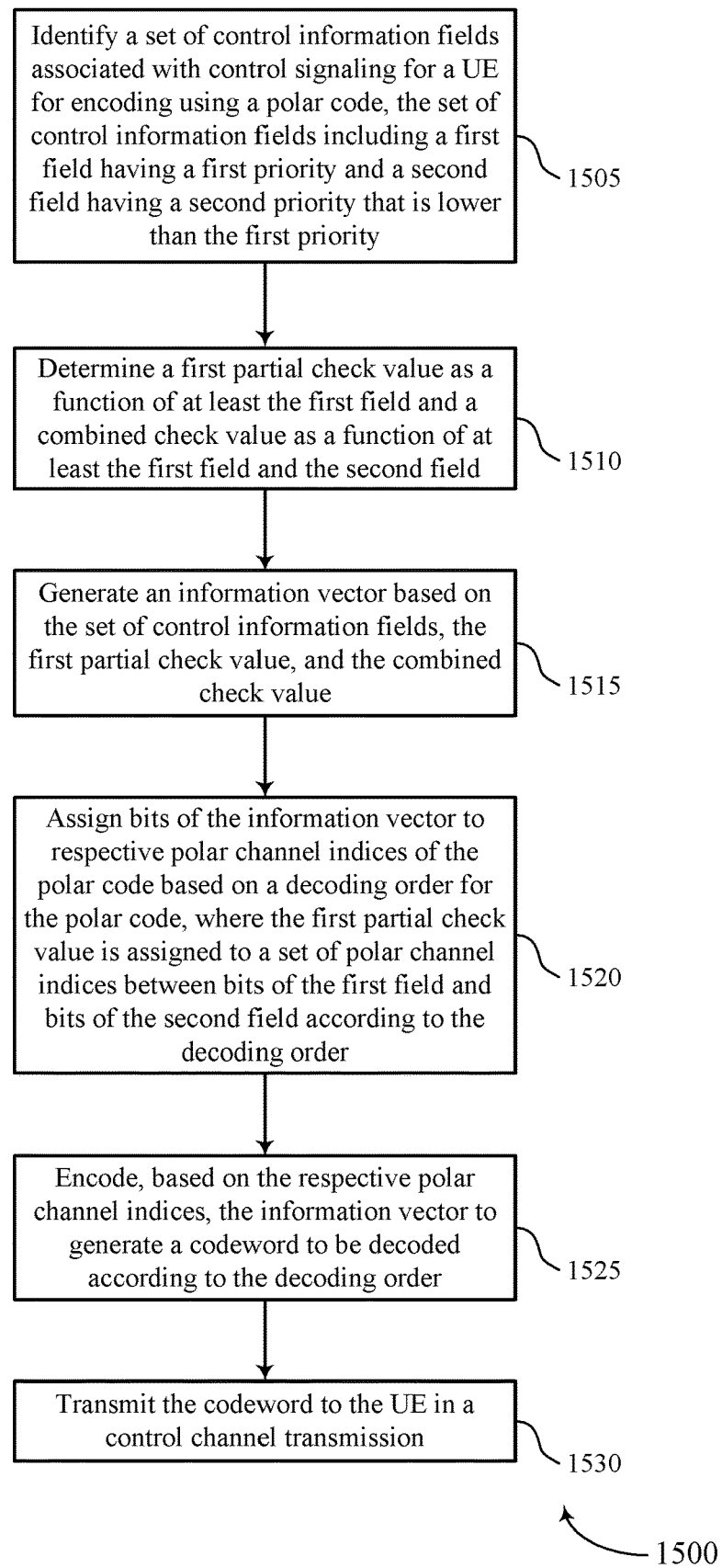
FIGS. 15 through 16 illustrate methods for field prioritization for polar codes in accordance with aspects of the present disclosure.

FIG. 15 shows a flowchart illustrating a method 1500 for field prioritization for polar codes in accordance with aspects of the present disclosure. The operations of method 1500 may be implemented by a base station 105 or its components as described herein. For example, the operations of method 1500 may be performed by a base station coding manager as described with reference to FIGS. 7 through 10. In some examples, a base station 105 may execute a set of codes to control the functional elements of the device to perform the functions described below. Additionally or alternatively, the base station 105 may perform aspects of the functions described below using special-purpose hardware.

At block 1505 the base station 105 may identify a plurality of control information fields associated with control signaling for a UE for encoding using a polar code, the plurality of control information fields including a first field having a first priority and a second field having a second priority that is lower than the first priority. The operations of block 1505 may be performed according to the methods described herein. In certain examples, aspects of the operations of block 1505 may be performed by a field component as described with reference to FIGS. 7 through 10.

At block 1510 the base station 105 may determine a first partial check value as a function of at least the first field and a combined check value as a function of at least the first field and the second field. The operations of block 1510 may be performed according to the methods described herein. In certain examples, aspects of the operations of block 1510 may be performed by a partial check component as described with reference to FIGS. 7 through 10.

At block 1515 the base station 105 may generate an information vector based on the plurality of control information fields, the first partial check value, and the combined check value. The operations of block 1515 may be performed according to the methods described herein. In certain examples, aspects of the operations of block 1515 may be performed by a vector generator as described with reference to FIGS. 7 through 10.

At block 1520 the base station 105 may assign bits of the information vector to respective polar channel indices of the polar code based at least in part on a decoding order for the polar code, where the first partial check value is assigned to a set of polar channel indices between bits of the first field and bits of the second field according to the decoding order. The operations of block 1520 may be performed according to the methods described herein. In certain examples, aspects of the operations of block 1520 may be performed by an assignment component as described with reference to FIGS. 7 through 10.

At block 1525 the base station 105 may encode, based at least in part on the respective polar channel indices, the information vector to generate a codeword to be decoded according to the decoding order. The operations of block 1525 may be performed according to the methods described herein. In certain examples, aspects of the operations of block 1525 may be performed by a encoder as described with reference to FIGS. 7 through 10.

At block 1530 the base station 105 may transmit the codeword to the UE in a control channel transmission. The operations of block 1530 may be performed according to the methods described herein. In certain examples, aspects of the operations of block 1530 may be performed by a transmission component as described with reference to FIGS. 7 through 10.

Figure 16:
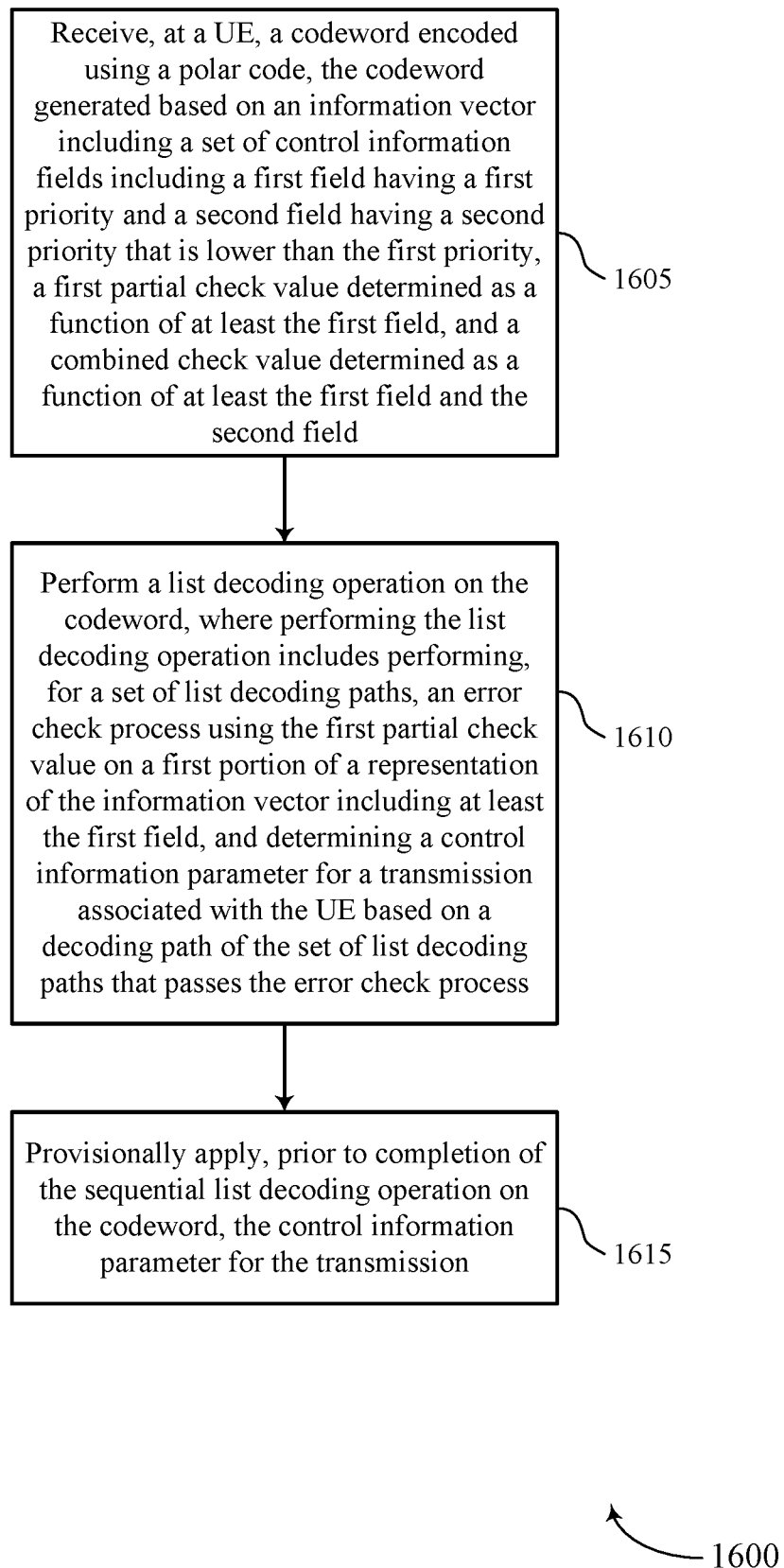

FIG. 16 shows a flowchart illustrating a method 1600 for field prioritization for polar codes in accordance with aspects of the present disclosure. The operations of method 1600 may be implemented by a UE 115 or its components as described herein. For example, the operations of method 1600 may be performed by a UE coding manager as described with reference to FIGS. 11 through 14. In some examples, a UE 115 may execute a set of codes to control the functional elements of the device to perform the functions described below. Additionally or alternatively, the UE 115 may perform aspects of the functions described below using special-purpose hardware.

At block 1605 the UE 115 may receive, at a UE, a codeword encoded using a polar code, the codeword generated based at least in part on an information vector including a plurality of control information fields including a first field having a first priority and a second field having a second priority that is lower than the first priority, a first partial check value determined as a function of at least the first field, and a combined check value determined as a function of at least the first field and the second field. The operations of block 1605 may be performed according to the methods described herein. In certain examples, aspects of the operations of block 1605 may be performed by a codeword receiver as described with reference to FIGS. 11 through 14.

At block 1610 the UE 115 may a sequential list decoding operation on the codeword in order of bit channel indices of the polar code, wherein performing the sequential list decoding operation includes performing, for a plurality of list decoding paths, an error check process using the first partial check value on first respective partial representations of the information vector comprising at least the first field, and determining a control information parameter for a transmission associated with the UE based at least in part on a decoding path of the plurality of list decoding paths having a first respective partial representation of the information vector that passes the error check process. The operations of block 1610 may be performed according to the methods described herein. In certain examples, aspects of the operations of block 1610 may be performed by a decoder or control component as described with reference to FIGS. 11 through 14.

At block 1615 the UE 115 may provisionally apply, prior to completion of the sequential list decoding operation on the codeword, the control information parameter for the transmission. The operations of block 1615 may be performed according to the methods described herein. In certain examples, aspects of the operations of block 1615 may be performed by a control component as described with reference to FIGS. 11 through 14.

It should be noted that the methods described above describe possible implementations, and that the operations and the steps may be rearranged or otherwise modified and that other implementations are possible. Further, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. The terms "system" and "network" are often used interchangeably. A code division multiple access (CDMA) system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE and LTE-A are releases of UMTS that use E-UTRA. UTRA, E-UTRA, UMTS, LTE, LTE-A, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects of an LTE or an NR system may be described for purposes of example, and LTE or NR terminology may be used in much of the description, the techniques described herein are applicable beyond LTE or NR applications.

In LTE/LTE-A networks, including such networks described herein, the term evolved node B (eNB) may be generally used to describe the base stations. The wireless communications system or systems described herein may include a heterogeneous LTE/LTE-A or NR network in which different types of eNBs provide coverage for various geographical regions. For example, each eNB, next generation NodeB (gNB), or base station may provide communication coverage for a macro cell, a small cell, or other types of cell. The term "cell" may be used to describe a base station, a carrier or component carrier associated with a base station, or a coverage area (e.g., sector, etc.) of a carrier or base station, depending on context.

Base stations may include or may be referred to by those skilled in the art as a base transceiver station, a radio base station, an access point, a radio transceiver, a NodeB, eNodeB (eNB), gNB, Home NodeB, a Home eNodeB, or some other suitable terminology. The geographic coverage area for a base station may be divided into sectors making up only a portion of the coverage area. The wireless communications system or systems described herein may include base stations of different types (e.g., macro or small cell base stations). The UEs described herein may be able to communicate with various types of base stations and network equipment including macro eNBs, small cell eNBs, gNBs, relay base stations, and the like. There may be overlapping geographic coverage areas for different technologies.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers).

The wireless communications system or systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The downlink transmissions described herein may also be called forward link transmissions while the uplink transmissions may also be called reverse link transmissions. Each communication link described herein—including, for example, wireless communications system 100 of FIG. 1—may include one or more carriers, where each carrier may be a signal made up of multiple sub-carriers (e.g., waveform signals of different frequencies).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may include RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
    identifying a plurality of control information fields associated with control signaling for a user equipment (UE) for encoding using a polar code, the plurality of control information fields comprising a first field having a first priority and a second field having a second priority that is lower than the first priority;

determining a first partial check value as a function of at least the first field and a combined check value as a function of at least the first field and the second field;
generating an information vector based on the plurality of control information fields, the first partial check value, and the combined check value;
assigning bits of the information vector to respective polar channel indices of the polar code based at least in part on a decoding order for the polar code, wherein the first partial check value is assigned to a set of polar channel indices between bits of the first field and bits of the second field according to the decoding order;
encoding, based at least in part on the respective polar channel indices, the information vector to generate a codeword to be decoded according to the decoding order; and
transmitting the codeword to the UE in a control channel transmission.

2. The method of claim 1, further comprising:
generating a second partial check value as a function of at least the second field, wherein the second partial check value is assigned to a second set of polar channel indices between bits of the second field and bits of the combined check value.

3. The method of claim 2, wherein the plurality of control information fields comprises a third field having a third priority that is lower than the second priority, and wherein the second set of polar channel indices is between bits of the second field and bits of the third field.

4. The method of claim 1, further comprising:
transmitting, to the UE, the codeword via a physical downlink control channel (PDCCH) message.

5. The method of claim 4, further comprising:
receiving, in response to the PDCCH message, a demodulation reference signal (DMRS) from the UE transmitted based at least in part on information indicated by the first field, wherein the DMRS is received within a predetermined time interval after transmission of the codeword.

6. The method of claim 5, wherein the predetermined time interval is three symbols.

7. The method of claim 1, further comprising:
generating a second information vector comprising at least a third field of the plurality of control information fields, wherein the information vector comprises an indication for the second information vector; and
encoding the second information vector to generate a second codeword, wherein the transmitting comprises transmitting the second codeword to the UE in the control channel transmission.

8. The method of claim 7, wherein the codeword and the second codeword are a same size.

9. The method of claim 8, further comprising:
generating a third information vector comprising at least a last field of the plurality of control information fields; and
encoding the third information vector to generate a third codeword comprising a different number of bits than the codeword and the second codeword, wherein the transmitting comprises transmitting the third codeword to the UE in the control channel transmission.

10. The method of claim 7, wherein the information vector and the second information vector are a same size.

11. The method of claim 1, further comprising:
determining, based at least in part on a latency threshold associated with the control signaling, whether to divide the plurality of control information fields into a plurality of information vectors for encoding into a plurality of codewords of a first size or to consolidate the plurality of control information fields into a single information vector for encoding into a single codeword of a second size, the second size being larger than the first size.

12. The method of claim 1, wherein the first field indicates a frequency domain resource allocation for the UE.

13. The method of claim 1, wherein the first field indicates header information corresponding to the plurality of control information fields.

14. The method of claim 1, wherein the first partial check value and the combined check value each comprise one of a parity check value or a cyclic redundancy check (CRC) value.

15. A method for wireless communication, comprising:
receiving, at a user equipment (UE), a codeword encoded using a polar code, the codeword generated based at least in part on an information vector comprising a plurality of control information fields including a first field having a first priority and a second field having a second priority that is lower than the first priority, a first partial check value determined as a function of at least the first field, and a combined check value determined as a function of at least the first field and the second field;
performing a sequential list decoding operation on the codeword in order of bit channel indices of the polar code, wherein performing the sequential list decoding operation comprises:
performing, for a plurality of list decoding paths, an error check process using the first partial check value on first respective partial representations of the information vector comprising at least the first field; and
determining a control information parameter for a transmission associated with the UE based at least in part on a decoding path of the plurality of list decoding paths having a first respective partial representation of the information vector that passes the error check process; and
provisionally applying, prior to completion of the sequential list decoding operation on the codeword, the control information parameter for the transmission.

16. The method of claim 15, wherein performing the sequential list decoding operation comprises:
performing, for the plurality of list decoding paths, a second error check process on second respective partial representations of the information vector for the plurality of list decoding paths using a second partial check value, the second respective partial representations of the information vector being subsequent to the first respective partial representations of the information vector according to the order of bit channel indices of the polar code.

17. The method of claim 16, further comprising:
revoking the provisional application of the control information parameter for the transmission based at least in part on a failure of the second error check process for the decoding path.

18. The method of claim 16, further comprising:
terminating, prior to completion of the sequential list decoding operation on the codeword, the sequential list decoding operation based at least in part on a failure of the second error check process for the decoding path.

19. The method of claim 16, further comprising:
terminating, prior to completion of the sequential list decoding operation on the codeword, the sequential list decoding operation based at least in part on a failure of the second error check process for all of the plurality of list decoding paths.

20. The method of claim 15, further comprising:
initiating, prior to completion of the sequential list decoding operation, a modem configuration for the transmission based at least in part on the control information parameter, wherein the modem configuration is associated with a demodulation reference signal (DMRS) transmitted by the UE in response to receiving the plurality of control information fields, wherein the DMRS is to be transmitted within a predetermined time interval after receiving the plurality of control information fields.

21. The method of claim 20, wherein the predetermined time interval comprises three symbols.

22. The method of claim 15, further comprising:
receiving a second codeword encoded using the polar code, the second codeword generated based at least in part on a second information vector comprising at least one of the plurality of control information fields; and
performing a second sequential list decoding operation on the second codeword to obtain the at least one of the plurality of control information fields.

23. The method of claim 22, wherein the codeword and the second codeword comprise a same number of bits.

24. The method of claim 15, wherein the first field indicates a frequency domain resource allocation for the UE.

25. An apparatus for wireless communication, comprising:
means for identifying a plurality of control information fields associated with control signaling for a user equipment (UE) for encoding using a polar code, the plurality of control information fields comprising a first field having a first priority and a second field having a second priority that is lower than the first priority;
means for determining a first partial check value as a function of at least the first field and a combined check value as a function of at least the first field and the second field;
means for generating an information vector based on the plurality of control information fields, the first partial check value, and the combined check value;
means for assigning bits of the information vector to respective polar channel indices of the polar code based at least in part on a decoding order for the polar code, wherein the first partial check value is assigned to a set of polar channel indices between bits of the first field and bits of the second field according to the decoding order;
means for encoding, based at least in part on the respective polar channel indices, the information vector to generate a codeword to be decoded according to the decoding order; and
means for transmitting the codeword to the UE in a control channel transmission.

26. The apparatus of claim 25, further comprising:
means for generating a second partial check value as a function of at least the second field, wherein the second partial check value is assigned to a second set of polar channel indices between bits of the second field and bits of the combined check value.

27. The apparatus of claim 26, wherein the plurality of control information fields comprises a third field having a third priority that is lower than the second priority, and wherein the second set of polar channel indices is between bits of the second field and bits of the third field.

28. The apparatus of claim 25, further comprising:
means for transmitting, to the UE, the codeword via a physical downlink control channel (PDCCH) message.

29. The apparatus of claim 28, further comprising:
means for receiving, in response to the PDCCH message, a demodulation reference signal (DMRS) from the UE transmitted based at least in part on information indicated by the first field, wherein the DMRS is received within a predetermined time interval after transmission of the codeword.

30. The apparatus of claim 29, wherein the predetermined time interval is three symbols.

31. The apparatus of claim 25, further comprising:
means for generating a second information vector comprising at least a third field of the plurality of control information fields, wherein the information vector comprises an indication for the second information vector; and
means for encoding the second information vector to generate a second codeword, wherein the transmitting comprises transmitting the second codeword to the UE in the control channel transmission.

32. The apparatus of claim 31, wherein the codeword and the second codeword are a same size.

33. The apparatus of claim 32, further comprising:
means for generating a third information vector comprising at least a last field of the plurality of control information fields; and
means for encoding the third information vector to generate a third codeword comprising a different number of bits than the codeword and the second codeword, wherein the transmitting comprises transmitting the third codeword to the UE in the control channel transmission.

34. The apparatus of claim 31, wherein the information vector and the second information vector are a same size.

35. The apparatus of claim 25, further comprising:
means for determining, based at least in part on a latency threshold associated with the control signaling, whether to divide the plurality of control information fields into a plurality of information vectors for encoding into a plurality of codewords of a first size or to consolidate the plurality of control information fields into a single information vector for encoding into a single codeword of a second size, the second size being larger than the first size.

36. The apparatus of claim 25, wherein the first field indicates a frequency domain resource allocation for the UE or header information corresponding to the plurality of control information fields.

37. The apparatus of claim 25, wherein the first partial check value and the combined check value each comprise one of a parity check value or a cyclic redundancy check (CRC) value.

38. An apparatus for wireless communication, comprising:
means for receiving, at a user equipment (UE), a codeword encoded using a polar code, the codeword generated based at least in part on an information vector comprising a plurality of control information fields including a first field having a first priority and a second field having a second priority that is lower than the first priority, a first partial check value determined as a function of at least the first field, and a combined check value determined as a function of at least the first field and the second field;

means for performing a sequential list decoding operation on the codeword in order of bit channel indices of the polar code, wherein the means for performing the sequential list decoding operation comprises:
  means for performing, for a plurality of list decoding paths, an error check process using the first partial check value on first respective partial representations of the information vector comprising at least the first field; and
  means for determining a control information parameter for a transmission associated with the UE based at least in part on a decoding path of the plurality of list decoding paths having a first respective partial representation of the information vector that passes the error check process; and
means for provisionally applying, prior to completion of the sequential list decoding operation on the codeword, the control information parameter for the transmission.

39. The apparatus of claim 38, wherein the means for performing the sequential list decoding operation comprises:
means for performing, for the plurality of list decoding paths, a second error check process on second respective partial representations of the information vector for the plurality of list decoding paths using a second partial check value, the second respective partial representations of the information vector being subsequent to the first respective partial representations of the information vector according to the order of bit channel indices of the polar code.

40. The apparatus of claim 39, further comprising:
means for revoking the provisional application of the control information parameter for the transmission based at least in part on a failure of the second error check process for the decoding path.

41. The apparatus of claim 39, further comprising:
means for terminating, prior to completion of the sequential list decoding operation on the codeword, the sequential list decoding operation based at least in part on a failure of the second error check process for the decoding path.

42. The apparatus of claim 39, further comprising:
means for terminating, prior to completion of the sequential list decoding operation on the codeword, the sequential list decoding operation based at least in part on a failure of the second error check process for all of the plurality of list decoding paths.

43. The apparatus of claim 38, further comprising:
means for initiating, prior to completion of the sequential list decoding operation, a modem configuration for the transmission based at least in part on the control information parameter, wherein the modem configuration is associated with a demodulation reference signal (DMRS) transmitted by the UE in response to receiving the plurality of control information fields, wherein the DMRS is to be transmitted within a predetermined time interval after receiving the plurality of control information fields.

44. The apparatus of claim 43, wherein the predetermined time interval comprises three symbols.

45. The apparatus of claim 38, further comprising:
means for receiving a second codeword encoded using the polar code, the second codeword generated based at least in part on a second information vector comprising at least one of the plurality of control information fields; and means for performing a second sequential list decoding operation on the second codeword to obtain the at least one of the plurality of control information fields.

46. The apparatus of claim 45, wherein the codeword and the second codeword comprise a same number of bits.

47. The apparatus of claim 38, wherein the first field indicates a frequency domain resource allocation for the UE.

48. An apparatus for wireless communication, comprising:
a processor;
memory in electronic communication with the processor; and
instructions stored in the memory and operable, when executed by the processor, to cause the apparatus to:
  identify a plurality of control information fields associated with control signaling for a user equipment (UE) for encoding using a polar code, the plurality of control information fields comprising a first field having a first priority and a second field having a second priority that is lower than the first priority;
  determine a first partial check value as a function of at least the first field and a combined check value as a function of at least the first field and the second field;
  generate an information vector based on the plurality of control information fields, the first partial check value, and the combined check value;
  assign bits of the information vector to respective polar channel indices of the polar code based at least in part on a decoding order for the polar code, wherein the first partial check value is assigned to a set of polar channel indices between bits of the first field and bits of the second field according to the decoding order;
  encode, based at least in part on the respective polar channel indices, the information vector to generate a codeword to be decoded according to the decoding order; and
  transmit the codeword to the UE in a control channel transmission.

49. The apparatus of claim 48, wherein the instructions are further executable by the processor to:
generate a second partial check value as a function of at least the second field, wherein the second partial check value is assigned to a second set of polar channel indices between bits of the second field and bits of the combined check value.

50. The apparatus of claim 49, wherein the plurality of control information fields comprises a third field having a third priority that is lower than the second priority, and wherein the second set of polar channel indices is between bits of the second field and bits of the third field.

51. The apparatus of claim 48, wherein the instructions are further executable by the processor to:
transmit, to the UE, the codeword via a physical downlink control channel (PDCCH) message.

52. The apparatus of claim 51, wherein the instructions are further executable by the processor to:
receive, in response to the PDCCH message, a demodulation reference signal (DMRS) from the UE transmitted based at least in part on information indicated by the first field, wherein the DMRS is received within a predetermined time interval after transmission of the codeword.

53. The apparatus of claim 52, wherein the predetermined time interval is three symbols.

54. The apparatus of claim 48, wherein the instructions are further executable by the processor to:

generate a second information vector comprising at least a third field of the plurality of control information fields, wherein the information vector comprises an indication for the second information vector; and encode the second information vector to generate a second codeword, wherein the transmitting comprises transmitting the second codeword to the UE in the control channel transmission.

55. The apparatus of claim 54, wherein the codeword and the second codeword are a same size.

56. The apparatus of claim 55, wherein the instructions are further executable by the processor to:

generate a third information vector comprising at least a last field of the plurality of control information fields; and encode the third information vector to generate a third codeword comprising a different number of bits than the codeword and the second codeword, wherein the transmitting comprises transmitting the third codeword to the UE in the control channel transmission.

57. The apparatus of claim 54, wherein the information vector and the second information vector are a same size.

58. The apparatus of claim 48, wherein the instructions are further executable by the processor to:

determine, based at least in part on a latency threshold associated with the control signaling, whether to divide the plurality of control information fields into a plurality of information vectors for encoding into a plurality of codewords of a first size or to consolidate the plurality of control information fields into a single information vector for encoding into a single codeword of a second size, the second size being larger than the first size.

59. The apparatus of claim 48, wherein the first field indicates a frequency domain resource allocation for the UE or header information corresponding to the plurality of control information fields.

60. The apparatus of claim 48, wherein the first partial check value and the combined check value each comprise one of a parity check value or a cyclic redundancy check (CRC) value.

61. An apparatus for wireless communication, comprising:

a processor;

memory in electronic communication with the processor; and instructions stored in the memory and operable, when executed by the processor, to cause the apparatus to:

receive, at a user equipment (UE), a codeword encoded using a polar code, the codeword generated based at least in part on an information vector comprising a plurality of control information fields including a first field having a first priority and a second field having a second priority that is lower than the first priority, a first partial check value determined as a function of at least the first field, and a combined check value determined as a function of at least the first field and the second field;

perform a sequential list decoding operation on the codeword in order of bit channel indices of the polar code, wherein performing the sequential list decoding operation comprises:

performing, for a plurality of list decoding paths, an error check process using the first partial check value on first respective partial representations of the information vector comprising at least the first field; and determining a control information parameter for a transmission associated with the UE based at least in part on a decoding path of the plurality of list decoding paths having a first respective partial representation of the information vector that passes the error check process; and provisionally apply, prior to completion of the sequential list decoding operation on the codeword, the control information parameter for the transmission.

62. The apparatus of claim 61, wherein the instructions are further executable by the processor to:

perform, for the plurality of list decoding paths, a second error check process on second respective partial representations of the information vector for the plurality of list decoding paths using a second partial check value, the second respective partial representations of the information vector being subsequent to the first respective partial representations of the information vector according to the order of bit channel indices of the polar code.

63. The apparatus of claim 62, wherein the instructions are further executable by the processor to:

revoke the provisional application of the control information parameter for the transmission based at least in part on a failure of the second error check process for the decoding path.

64. The apparatus of claim 62, wherein the instructions are further executable by the processor to:

terminate, prior to completion of the sequential list decoding operation on the codeword, the sequential list decoding operation based at least in part on a failure of the second error check process for the decoding path.

65. The apparatus of claim 62, wherein the instructions are further executable by the processor to:

terminate, prior to completion of the sequential list decoding operation on the codeword, the sequential list decoding operation based at least in part on a failure of the second error check process for the decoding path.

66. The apparatus of claim 61, wherein the instructions are further executable by the processor to:

initiate, prior to completion of the sequential list decoding operation, a modem configuration for the transmission based at least in part on the control information parameter, wherein the modem configuration is associated with a demodulation reference signal (DMRS) transmitted by the UE in response to receiving the plurality of control information fields, wherein the DMRS is to be transmitted within a predetermined time interval after receiving the plurality of control information fields.

67. The apparatus of claim 66, wherein the predetermined time interval comprises three symbols.

68. The apparatus of claim 61, wherein the instructions are further executable by the processor to:

receive a second codeword encoded using the polar code, the second codeword generated based at least in part on a second information vector comprising at least one of the plurality of control information fields; and perform a second sequential list decoding operation on the second codeword to obtain the at least one of the plurality of control information fields.

69. The apparatus of claim 68, wherein the codeword and the second codeword comprise a same number of bits.

70. The apparatus of claim 61, wherein the first field indicates a frequency domain resource allocation for the UE.

71. A non-transitory computer readable medium storing code for wireless communication, the code comprising instructions executable by a processor to:
- identify a plurality of control information fields associated with control signaling for a user equipment (UE) for encoding using a polar code, the plurality of control information fields comprising a first field having a first priority and a second field having a second priority that is lower than the first priority;
- determine a first partial check value as a function of at least the first field and a combined check value as a function of at least the first field and the second field;
- generate an information vector based on the plurality of control information fields, the first partial check value, and the combined check value;
- assign bits of the information vector to respective polar channel indices of the polar code based at least in part on a decoding order for the polar code, wherein the first partial check value is assigned to a set of polar channel indices between bits of the first field and bits of the second field according to the decoding order;
- encode, based at least in part on the respective polar channel indices, the information vector to generate a codeword to be decoded according to the decoding order; and
- transmit the codeword to the UE in a control channel transmission.

72. A non-transitory computer readable medium storing code for wireless communication, the code comprising instructions executable by a processor to:
- receive, at a user equipment (UE), a codeword encoded using a polar code, the codeword generated based at least in part on an information vector comprising a plurality of control information fields including a first field having a first priority and a second field having a second priority that is lower than the first priority, a first partial check value determined as a function of at least the first field, and a combined check value determined as a function of at least the first field and the second field;
- perform a sequential list decoding operation on the codeword in order of bit channel indices of the polar code, wherein performing the sequential list decoding operation comprises:
  - performing, for a plurality of list decoding paths, an error check process using the first partial check value on first respective partial representations of the information vector comprising at least the first field; and
  - determining a control information parameter for a transmission associated with the UE based at least in part on a decoding path of the plurality of list decoding paths having a first respective partial representation of the information vector that passes the error check process; and
- provisionally apply, prior to completion of the sequential list decoding operation on the codeword, the control information parameter for the transmission.

* * * * *